US012108589B2

United States Patent
Sakui et al.

(10) Patent No.: US 12,108,589 B2
(45) Date of Patent: *Oct. 1, 2024

(54) MEMORY DEVICE THROUGH USE OF SEMICONDUCTOR DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 355 days.

This patent is subject to a terminal disclaimer.

(21) Appl. No.: 17/741,914

(22) Filed: May 11, 2022

(65) Prior Publication Data

US 2022/0367469 A1    Nov. 17, 2022

(51) Int. Cl.
*G11C 11/40* (2006.01)
*G11C 11/404* (2006.01)
(Continued)

(52) U.S. Cl.
CPC ............ *H10B 12/20* (2023.02); *G11C 11/404* (2013.01); *G11C 11/4096* (2013.01)

(58) Field of Classification Search
CPC ...... H10B 12/20; H10B 12/036; H10B 12/05; H10B 12/33; G11C 11/404;
(Continued)

(56) References Cited

U.S. PATENT DOCUMENTS

| 2003/0111681 A1 | 6/2003 | Kawanaka |
| 2006/0049444 A1 | 3/2006 | Shino |

(Continued)

FOREIGN PATENT DOCUMENTS

| JP | H 02-188966 A | 7/1990 |
| JP | H 03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Mohammed A Bashar
(74) *Attorney, Agent, or Firm* — Crowell & Moring LLP

(57) ABSTRACT

A memory device includes pages, each being composed of a plurality of memory cells arrayed on a substrate in row form. The memory device controls voltages to be applied to a first gate conductor layer, a second gate conductor layer, a first impurity region, and a second impurity region of each of the memory cells included in the pages to perform a page write operation of holding a hole group formed by an impact ionization phenomenon or a gate induced drain leakage current in a channel semiconductor layer, and controls voltages to be applied to the first gate conductor layer, the second gate conductor layer, the third gate conductor layer, the fourth gate conductor layer, the first impurity region, and the second impurity region to perform a page erase operation of removing the hole group out of the channel semiconductor layer. The first impurity layer of each of the memory cells is connected to a source line, the second impurity region is connected to a bit line, one of the first gate conductor layer and the second gate conductor layer is connected to a word line, and the other is connected to a first driving control line. The bit line is connected to a sense amplifier circuit via a switching circuit. When in a page read operation, the memory device reads page data in a memory cell group selected by the word line to the bit line, and performs charge sharing between the bit line and a charge sharing node of the switching circuit opposite to the bit line to accelerate a read determination by the sense amplifier circuit.

5 Claims, 18 Drawing Sheets

(51) Int. Cl.
*G11C 11/4096* (2006.01)
*H10B 12/00* (2023.01)

(58) Field of Classification Search
CPC ............ G11C 11/4096; G11C 11/4094; G11C 11/4091; G11C 2211/4016
See application file for complete search history.

(56) References Cited

U.S. PATENT DOCUMENTS

| | | |
|---|---|---|
| 2008/0137394 A1 | 6/2008 | Shimano |
| 2008/0212366 A1 | 9/2008 | Ohsawa |
| 2010/0117141 A1* | 5/2010 | Shin .................. H01L 29/66833 257/326 |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "PHase Change Memory," Proceeding of the IEEE, vol. 98, No. 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelsona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, No. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Emebedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7 pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transistors on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

International Search Report (PCT/ISA/210) (Japanese) from PCT/JP2021/018247 dated Jun. 29, 2021, 3 pgs.

English translation of International Search of Search Report (PCT/ISA/210) of PCT/JP2021/018247, 2 pgs.

Written Opinion (PCT/ISA/237) (Japanese) of PCT/JP2021/018247 dated Jun. 22, 2021, 3 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E-90-c., No. 4 pp. 765-771 (2007) a brief description attached.

* cited by examiner

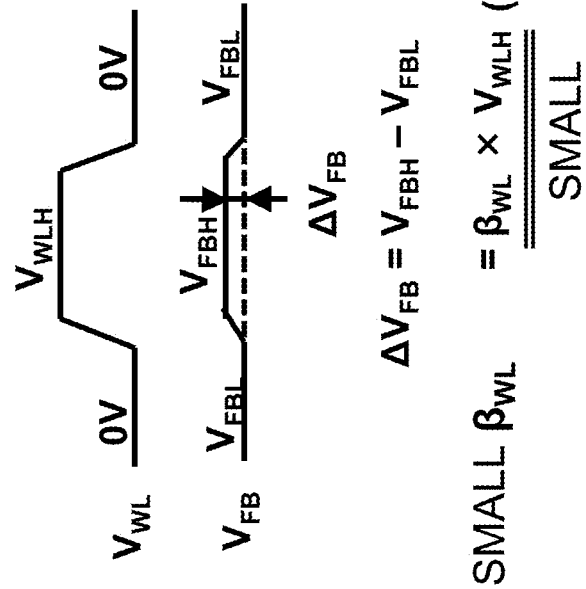
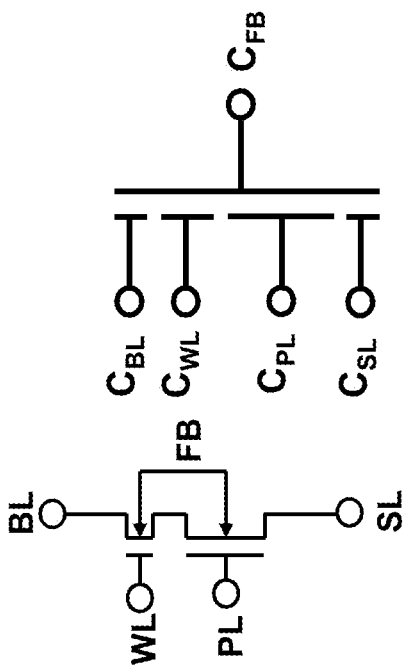
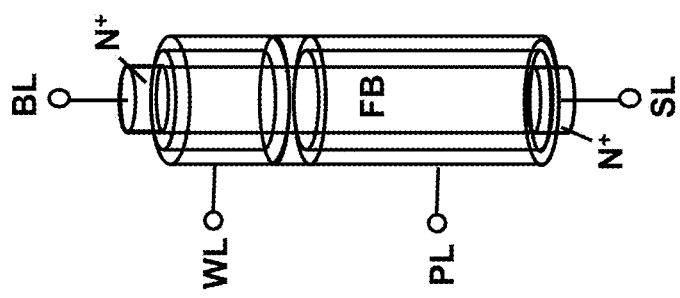

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{SMALL } \beta_{WL}$$

$$\beta_{PL} = \frac{C_{PL}}{C_{WL} + C_{PL} + C_{BL} + C_{SL}} \quad (3) \Rightarrow \text{LARGE } \beta_{PL}$$

$$\beta_{BL} = \frac{C_{BL}}{C_{WL} + C_{PL} + C_{BL} + C_{SL}} \quad (4) \Rightarrow \text{SMALL } \beta_{BL}$$

$$\beta_{SL} = \frac{C_{SL}}{C_{WL} + C_{PL} + C_{BL} + C_{SL}} \quad (5) \Rightarrow \text{SMALL } \beta_{SL}$$

$$\Delta V_{FB} = V_{FBH} - V_{FBL} = \beta_{WL} \times V_{WLH} \quad (6)$$
$$\underline{\underline{\text{SMALL}}}$$

FIG.3AB
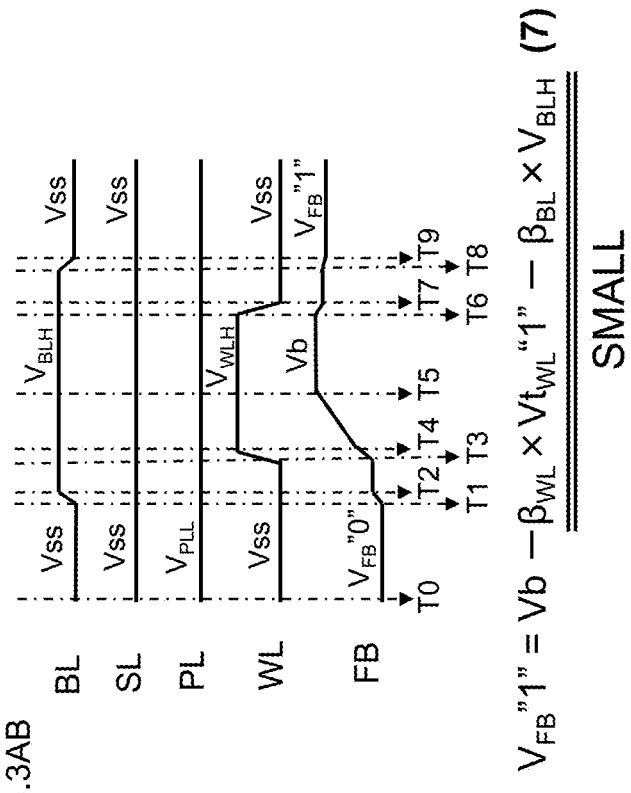
$$V_{FB}"1" = Vb - \beta_{WL} \times Vt_{WL}"1" - \beta_{BL} \times V_{BLH} \quad (7)$$
SMALL
FIG. 3AA  "1" PAGE WRITE OPERATION
SOURCE-SIDE IMPACT IONIZATION
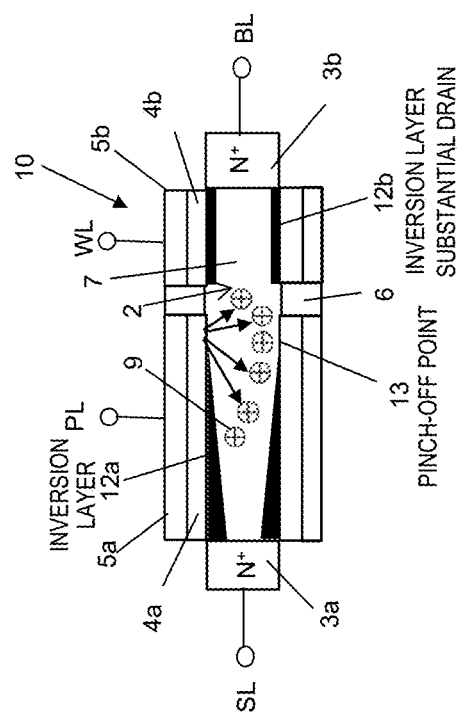
FIG. 3AC  "1" WRITE STATE
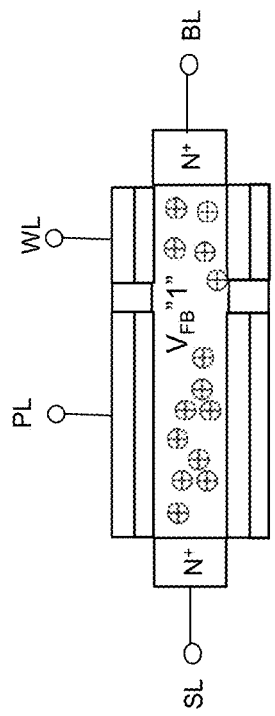

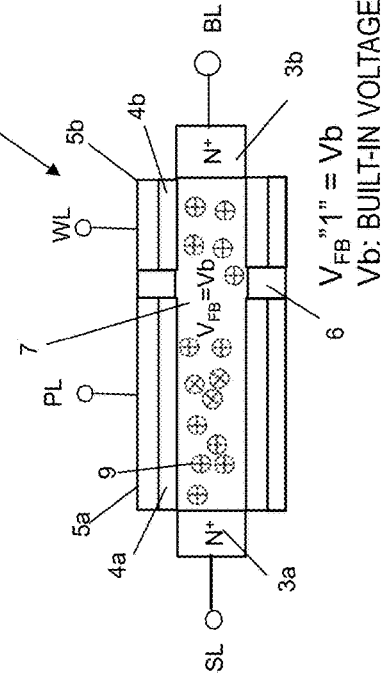

FIG. 4BA "0" PAGE ERASE OPERATION TIMING DIAGRAM

T3 TO T4: FIRST PERIOD
T5 TO T6: SECOND PERIOD
T9 TO T10: THIRD PERIOD

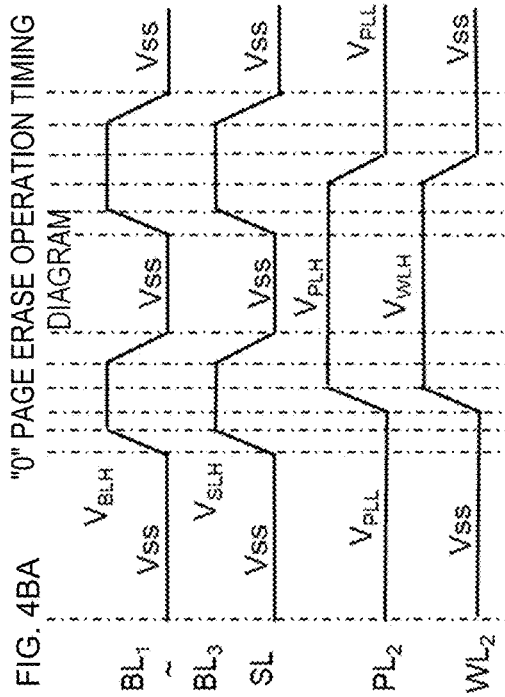

FIG. 4BC DISCHARGE HOLE GROUP 9 IN "0" ERASE OPERATION (T5 TO T6)

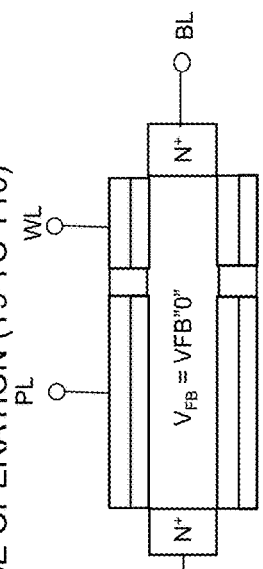

FIG. 4BB "1" WRITE STATE (T0)

$V_{FB}\text{"1"} = Vb$
Vb: BUILT-IN VOLTAGE $V_{FB}\text{"1"} = Vb - \beta_{WL} \times Vt_{WL}\text{"1"} - \beta_{BL} \times V_{BLH}$ (7)

$V_{FB}\text{"0"} = Vb - \beta_{WL} \times V_{WLH} - \beta_{PL} \times (V_{PLH} - V_{PLL})$ (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL})$
$- \beta_{WL} \times Vt_{WL}\text{"1"} - \beta_{BL} \times V_{BLH}$ (9)

WORD LINE WL AND PLATE LINE PL ARE CAPACITIVELY COUPLED TO CHANNEL REGION 7 IN "0" ERASE OPERATION (T9 TO T10)

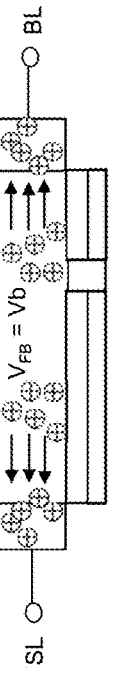

FIG. 4BD $V_{FB} = VFB\text{"0"}$

Vb: BUILT-IN VOLTAGE ~0.7 V

FIG. 4DA "0" PAGE ERASE OPERATION TIMING DIAGRAM

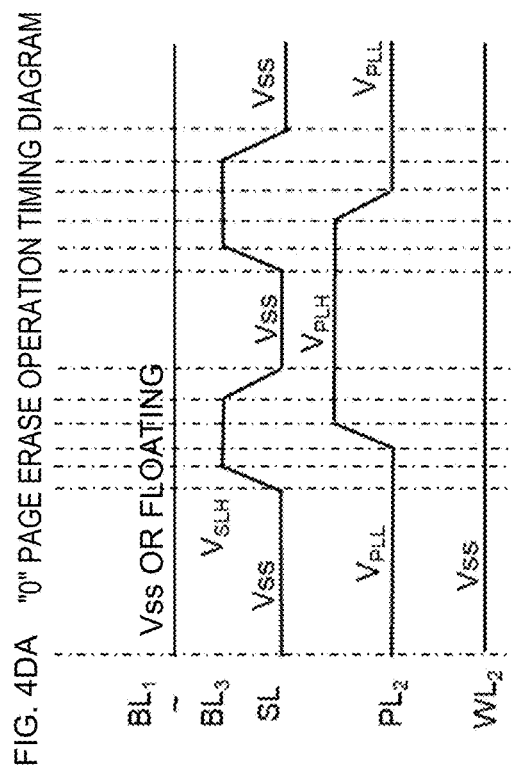

T3 TO T4: FIRST PERIOD
T5 TO T6: SECOND PERIOD
T9 TO T10: THIRD PERIOD
DISCHARGE HOLE GROUP 9 IN "0" ERASE OPERATION (T5 TO T6)

FIG. 4DB "1" WRITE STATE (T0)

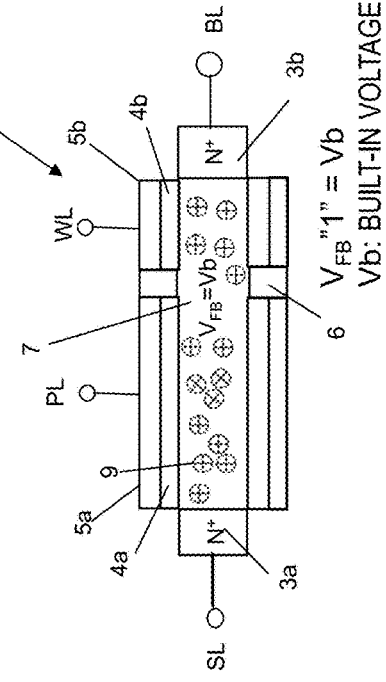

$V_{FB}\text{"}1\text{"} = Vb$
Vb: BUILT-IN VOLTAGE $V_{FB}\text{"}1\text{"} = Vb - \beta_{WL} \times Vt_{WL}\text{"}1\text{"} - \beta_{BL} \times V_{BLH}$ (7)

$V_{FB}\text{"}0\text{"} = Vb - \beta_{WL} \times V_{WLH} - \beta_{PL} \times (V_{PLH} - V_{PLL})$ (8)

$\Delta V_{FB} = V_{FB}\text{"}1\text{"} - V_{FB}\text{"}0\text{"}$
$= \beta_{WL} \times V_{WLH} + \beta_{PL} \times (V_{PLH} - V_{PLL})$
$- \beta_{WL} \times Vt_{WL}\text{"}1\text{"} - \beta_{BL} \times V_{BLH}$ (9)

WORD LINE WL AND PLATE LINE PL ARE CAPACITIVELY COUPLED TO CHANNEL REGION 7 IN "0" ERASE OPERATION (T9 TO T10)

FIG. 4DC

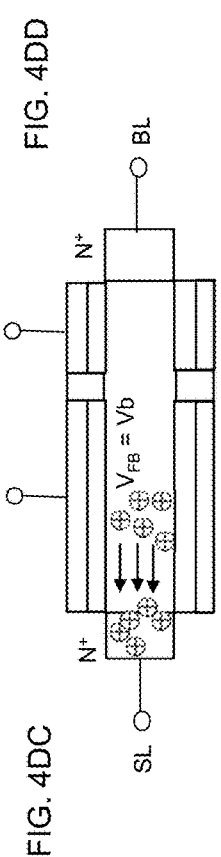

FIG. 4DD

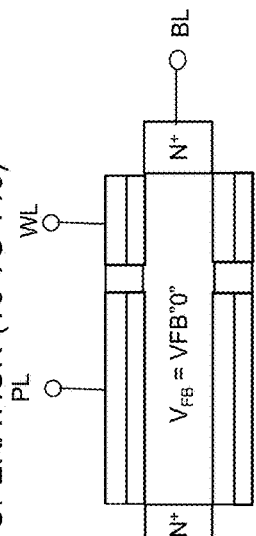

Vb: BUILT-IN VOLTAGE ~0.7 V

FIG. 4EA "0" PAGE ERASE OPERATION TIMING DIAGRAM

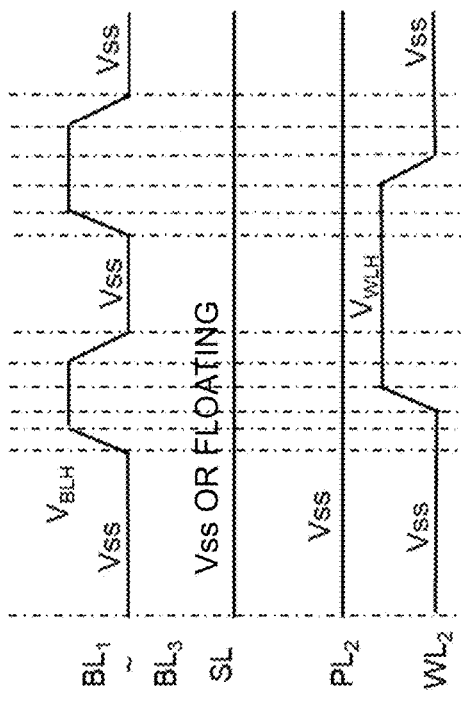

T3 TO T4: FIRST PERIOD
T5 TO T6: SECOND PERIOD
T9 TO T10: THIRD PERIOD
DISCHARGE HOLE GROUP 9 IN "0" ERASE OPERATION (T5 TO T6)

FIG. 4EB "1" WRITE STATE (T0)

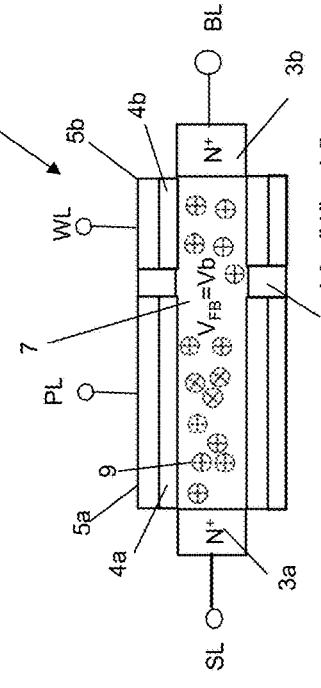

$V_{FB}\text{"1"} = V_b$
$V_b$: BUILT-IN VOLTAGE $$V_{FB}\text{"1"} = V_b - \beta_{WL} \times Vt_{WL}\text{"1"} - \beta_{BL} \times V_{BLH} \quad (7)$$

$$V_{FB}\text{"0"} = V_b - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"}$$
$$= \beta_{WL} \times V_{WLH} + \beta_{PL} \times (V_{PLH} - V_{PLL})$$
$$- \beta_{WL} \times Vt_{WL}\text{"1"} - \beta_{BL} \times V_{BLH} \quad (9)$$

WORD LINE WL AND PLATE LINE PL ARE CAPACITIVELY COUPLED TO CHANNEL REGION 7 IN "0" ERASE OPERATION (T9 TO T10)

FIG. 4EC

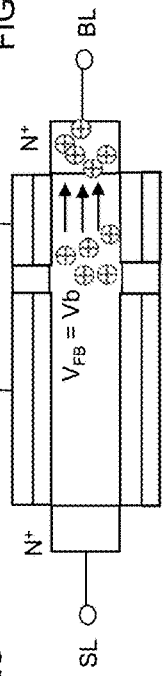

FIG. 4ED

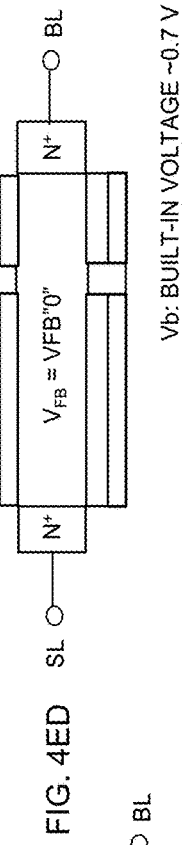

$V_{FB} = V_{FB}\text{"0"}$ $V_b$: BUILT-IN VOLTAGE ~0.7 V

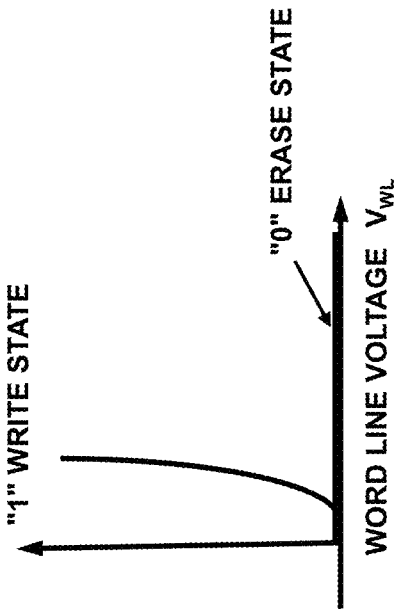
FIG. 5C
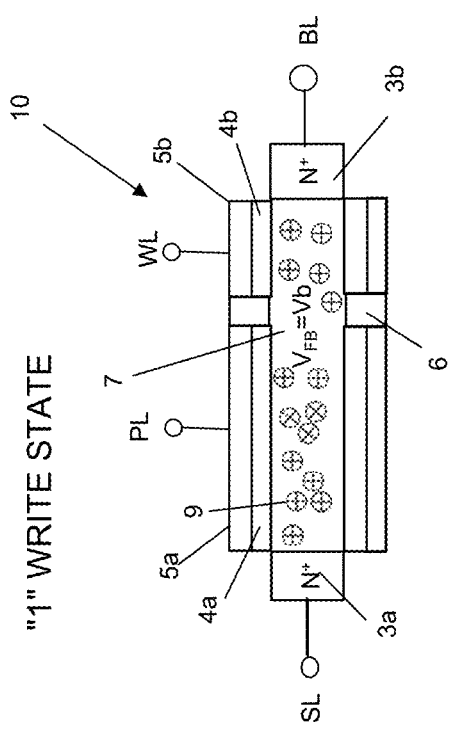
FIG. 5A "1" WRITE STATE
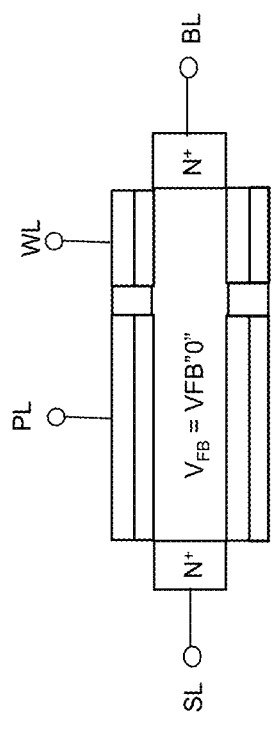
FIG. 5B "0" ERASE STATE
Vb: BUILT-IN VOLTAGE ~0.7 V FIG. 6A
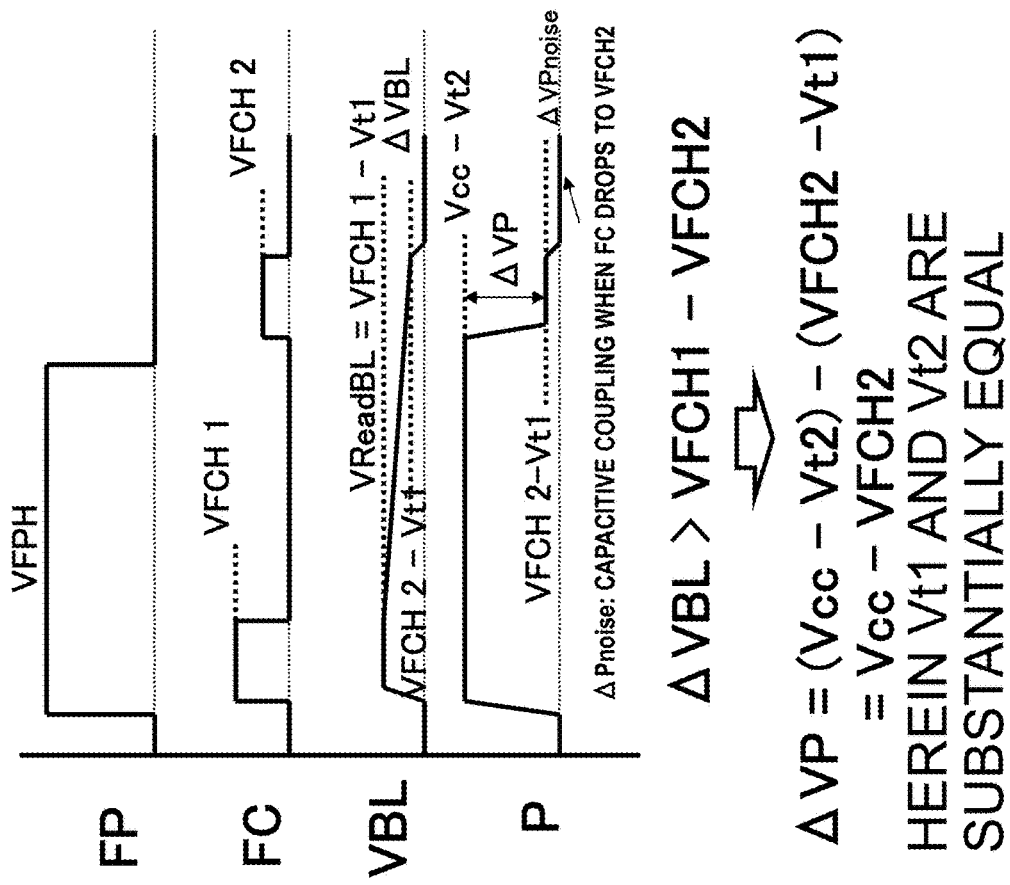
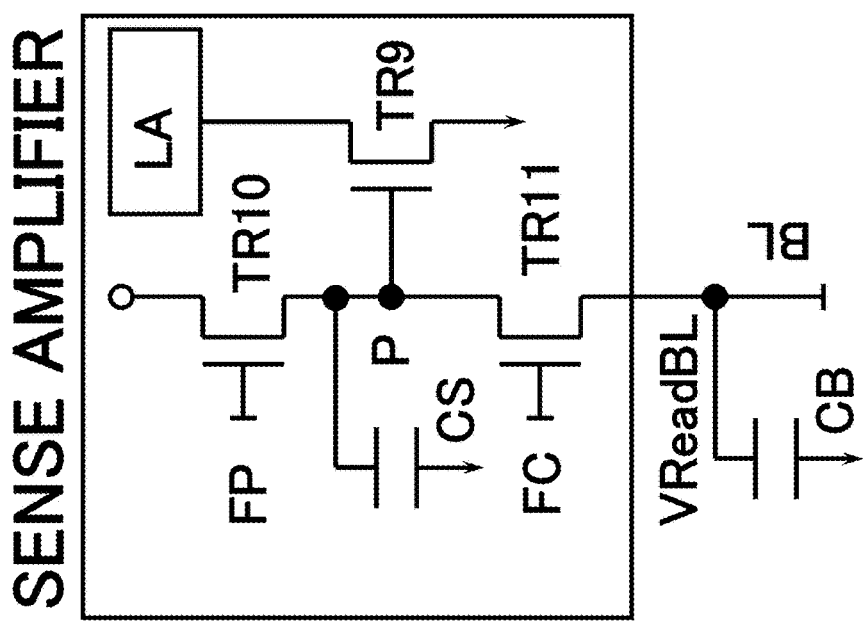

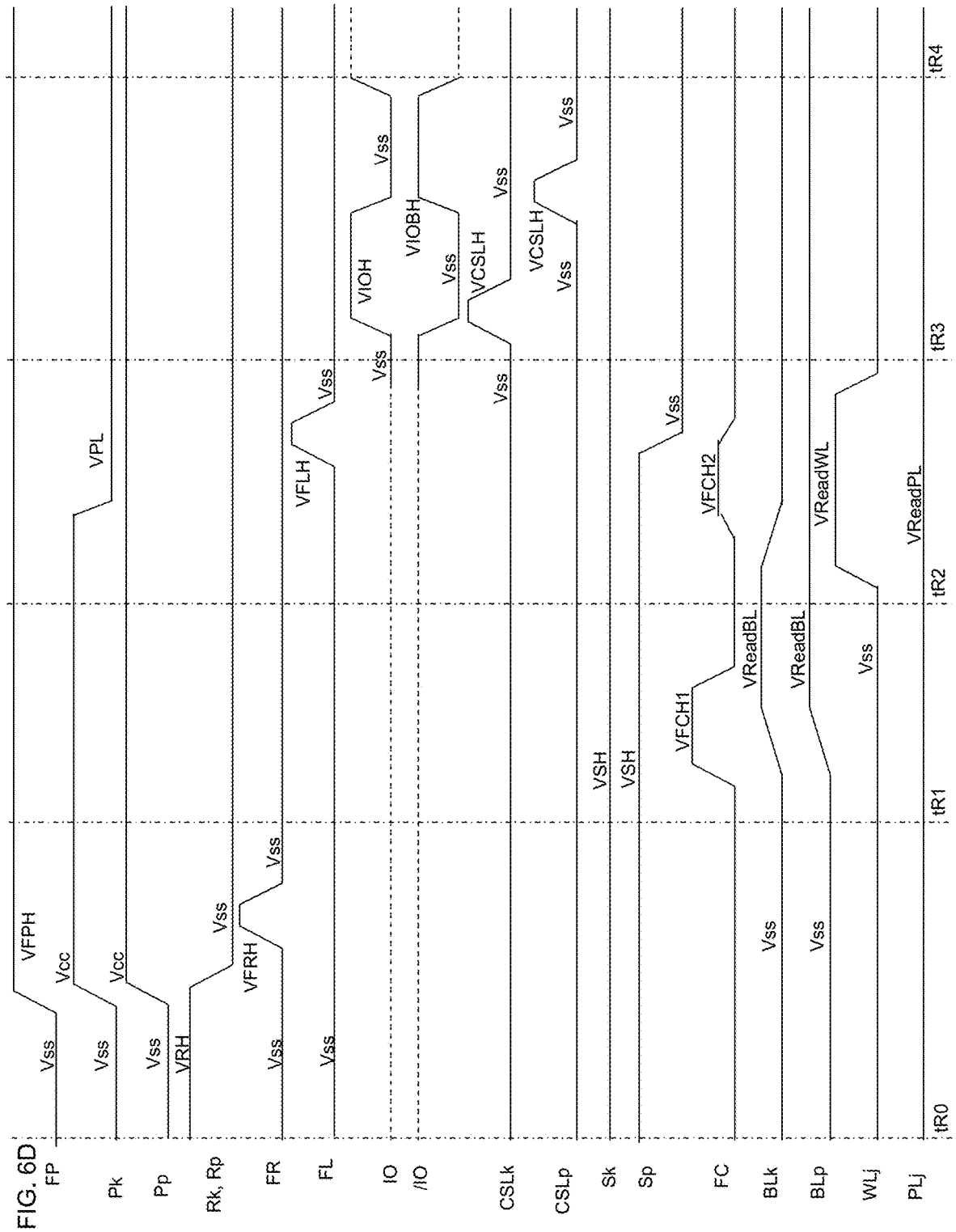

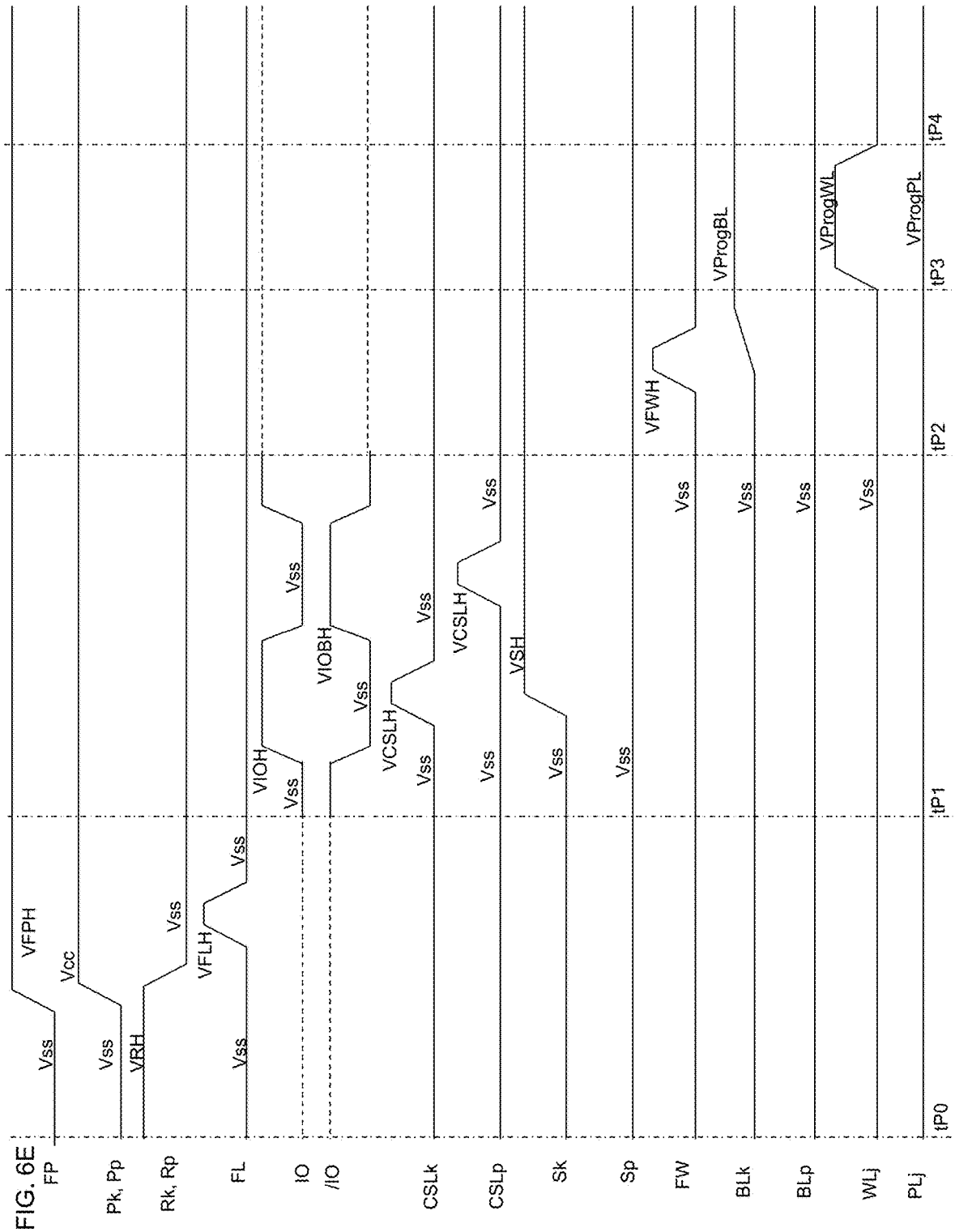

$$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

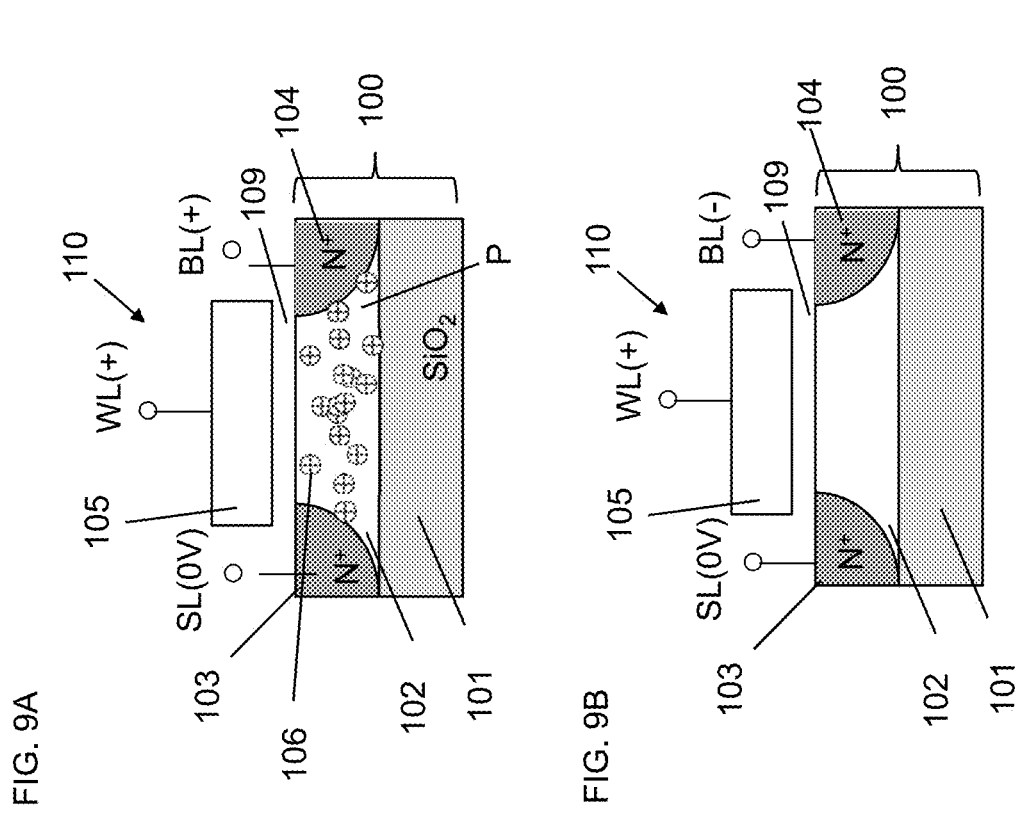

MEMORY DEVICE THROUGH USE OF SEMICONDUCTOR DEVICE

CROSS-REFERENCE TO RELATED APPLICATIONS

This application claims priority under 35 U.S.C. § 119(a) to PCT/JP2021/018247 filed May 13, 2021, the enter content of which is incorporated herein by reference.

TECHNICAL FIELD

The present invention relates to a memory device through use of a semiconductor device.

BACKGROUND ART

In recent years, in development of the large scale integration (LSI) technology, memory devices have been required to have higher integration and higher performance.

In typical planar MOS transistors, the channel extends in a horizontal direction along an upper surface of a semiconductor substrate. On the other hand, the channel of an SGT extends in a direction vertical to the upper surface of a semiconductor substrate (see Patent Literature 1 and Non Patent Literature 1, for example). Thus, the SGT enables a semiconductor device to have higher density than a planar MOS transistor does. The use of this SGT as a selection transistor can achieve higher integration of memories such as a dynamic random access memory (DRAM; see Non Patent Literature 2, for example) to which a capacitor is connected, a phase change memory (PCM; see Non Patent Literature 3, for example) to which a resistance change element is connected, a resistive random access memory (RRAM; see Non Patent Literature 4, for example), and a magneto-resistive random access memory (MRAM; see Non Patent Literature 5, for example) in which the orientation of magnetic spin is changed by a current to change resistance. In addition, there are a capacitor-less DRAM memory cell composed of a single MOS transistor (see Non Patent Literature 7), and the like. The present application relates to a dynamic flash memory which does not have a resistance change element or capacitor and which can be composed only of a MOS transistor.

FIGS. 7A to 7D show a write operation of the aforementioned capacitor-less DRAM memory cell composed of a single MOS transistor, FIGS. 8A and 8B show operational problems, and FIGS. 9A to 9C show a read operation (see Non Patent Literatures 7 to 10). FIG. 7A shows a "1" write state. Herein, the memory cell is formed in a SOI substrate 100. The DRAM memory cell composed of a source N$^+$ layer 103 (hereinafter a semiconductor region containing a high concentration of donor impurities will be referred to as an "N$^+$ layer") to which a source line SL is connected, a drain N$^+$ layer 104 to which a bit line BL is connected, a gate conductor layer 105 to which a word line WL is connected, and a floating body 102 of the MOS transistor 110, not having a capacitor, and having the single MOS transistor 110 is configured. Note that a SiO$_2$ layer 101 in the SOI substrate is located immediately under and in contact with the floating body 102. When writing "1" into the memory cell composed of this single MOS transistor 110, the MOS transistor 110 is operated in a saturation region. In other words, an electron channel 107 extending from the source N$^+$ layer 103 has a pinch-off point 108, and does not reach the drain N$^+$ layer 104 to which the bit line is connected. When the MOS transistor 110 is operated with both the bit line BL thus connected to the drain N$^+$ layer and the word line WL connected to the gate conductor layer 105 being increased in voltage, and a gate voltage being set at about half of a drain voltage, the field intensity is maximized at the pinch-off point 108 in the vicinity of the drain N$^+$ layer 104. As a result, accelerated electrons flowing from the source N$^+$ layer 103 to the drain N$^+$ layer 104 collide with a Si lattice, and electron-hole pairs are generated by kinetic energy lost at that time (an impact ionization phenomenon). A large part of generated electrons (not shown) reaches the drain N$^+$ layer 104. In addition, only a few, very hot electrons jump across the gate oxide film 109 to reach the gate conductor layer 105. Then, holes 106 generated at the same time charge the floating body 102. In this case, the generated holes contribute as an increment in majority carriers because the floating body 102 is P-Si. The floating body 102 is filled with the generated holes 106, and when the voltage of the floating body 102 becomes more than or equal to Vb exceeding the voltage of the source N$^+$ layer 103, further generated holes are discharged to the source N$^+$ layer 103. Herein, Vb is a built-in voltage of a PN junction between the source N$^+$ layer 103 and the floating body 102 which is the P layer, and is about 0.7 V. FIG. 7B shows a way in which the floating body 102 is charged to saturation with the generated holes 106.

Next, a "0" write operation in the memory cell 110 will be described with reference to FIG. 7C. The "1" write memory cell 110 and the "0" write memory cell 110 are present at random for a common selected word line WL. FIG. 7C shows a way in which the "1" write state is rewritten to the "0" write state. When writing "0", the voltage of the bit line BL is negatively biased, and the PN junction between the drain N$^+$ layer 104 and the floating body 102 which is the P layer is forward-biased. As a result, the holes 106 generated in the floating body 102 in advance in a previous cycle flow to the drain N' layer 104 connected to the bit line BL. When the write operation is terminated, two memory cell states of the memory cell 110 filled with the generated holes 106 (FIG. 7B) and the memory cell 110 from which generated holes have been discharged (FIG. 7C) are obtained. The potential of the floating body 102 in the memory cell 110 filled with the holes 106 becomes higher than the potential of the floating body 102 free from generated holes. Consequently, the threshold voltage of the "1" write memory cell 110 becomes lower than the threshold voltage of the "0" write memory cell 110. The way is shown in FIG. 7D.

Next, operational problems of the memory cell composed of this single MOS transistor 110 will be described with reference to FIGS. 8A and 8B. As shown in FIG. 8A, a capacitance $C_{FB}$ of the floating body is the sum of a capacitance $C_{WL}$ between the gate to which the word line is connected and the floating body, a junction capacitance $C_{SL}$ of the PN junction between the source N$^+$ layer 103 to which the source line is connected and the floating body 102, and a junction capacitance $C_{BL}$ of the PN junction between the drain N$^+$ layer 104 to which the bit line is connected and the floating body 102, which is expressed as:

$$C_{FB}=C_{WL}+C_{BL}+C_{SL} \tag{10}$$

In addition, a capacitive coupling ratio $\beta_{WL}$ between the gate to which the word line is connected and the floating body is expressed as:

$$\beta_{WL}=C_{WL}/(C_{WL}+C_{BL}+C_{SL}) \tag{11}$$

Consequently, when a word line voltage $V_{WL}$ oscillates during reading or during writing, the voltage of the floating body 102 to serve as a storage node (contact point) of the memory cell is affected accordingly. The way is shown in FIG. 8B. When the word line voltage $V_{WL}$ rises from 0 V to $V_{WLH}$ during reading or during writing, the voltage $V_{FB}$ of the floating body 102 rises from a voltage $V_{FB1}$ in an initial state before the word line voltage changes to $V_{FB2}$ because of the capacitive coupling with the word line. A voltage change amount $\Delta V_{FB}$ thereof is expressed as:

$$\Delta V_{FB} = V_{FB2} - V_{FB1} \quad (12)$$
$$= \beta_{WL} \times V_{WLH}$$

Herein, a contribution ratio of $C_{WL}$ is large in $\beta_{WL}$ in Expression (11), and $C_{WL}:C_{BL}:C_{SL}=8:1:1$ holds, for example. In this case, $\beta_{WL}=0.8$ holds. When the word line drops from 5 V during writing to 0 V after writing is terminated, for example, the floating body 102 is subject to an amplitude noise as large as 5 V×$\beta_{WL}$=4 V because of the capacitive coupling between the word line WL and the floating body 102. This raises a problem in that a potential difference margin between the "1" potential and the "0" potential of the floating body 102 during writing cannot be sufficiently attained.

FIGS. 9A to 9C show a read operation. FIG. 9A shows the "1" write state, and FIG. 9B shows the "0" write state. Actually, however, even if Vb is written into the floating body 102 by writing "1", the floating body 102 is reduced to a negative bias when the word line returns to 0 V by termination of writing. When "0" is written, the floating body 102 is negatively biased more deeply, so that as shown in FIG. 9C, the "1" and "0" potential difference margin cannot be made sufficiently wide during writing. Thus, it has actually been difficult to bring a capacitor-less DRAM memory cell to production.

CITATION LIST

Patent Literature

[Patent Literature 1]
Japanese Patent Laid-Open No. 2-188966
[Patent Literature 2]
Japanese Patent Laid-Open No. 3-171768
[Patent Literature 3]
  Japanese Patent No. 3957774

Non Patent Literature

[Non Patent Literature 1]
  Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp.573-578 (1991)
[Non Patent Literature 2]
  H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[Non Patent Literature 3]
  H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp.2201-2227 (2010)
[Non Patent Literature 4]
  T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)
[Non Patent Literature 5]
  W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp.1-9 (2015)
[Non Patent Literature 6]
  M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp.405-407 (2010)
[Non Patent Literature 7]
  J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp.179-181 (2012)
[Non Patent Literature 8]
  T. Ohsawa, K. Fujita, T. Higashi, Y. Iwata, T. Kajiyama, Y. Asao, and K. Sunouchi: "Memory design using a one-transistor gain cell on SOI," IEEE JSSC, vol.37, No. 11, pp1510-1522 (2002).
[Non Patent Literature 9]
  T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[Non Patent Literature 10]
  E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).
[Non Patent Literature 11]
  J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp.186-191, May 2006.
[Non Patent Literature 12]
  N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
[Non Patent Literature 13]
  H. Jiang, N. Xu, B. Chen, L. Zengl, Y. He, G. Du, X. Liu and X. Zhang: "Experimental investigation of self-heating effect (SHE) in multiple-fin SOI FinFETs," Semicond. Sci. Technol. 29 (2014) 115021 (7pp).
[Non Patent Literature 14]
  E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-69, April 2006.

SUMMARY OF INVENTION

Technical Problem

In a capacitor-less, 1-transistor DRAM (gain cell), the capacitive coupling between the word line and the floating body is large, and when the potential of the word line is oscillated when reading data or when writing data, the oscillation is disadvantageously transmitted as noise directly to the floating body. As a result, problems of erroneous reading and erroneous rewriting of stored data are raised, and it has been difficult to put a capacitor-less, 1-transistor DRAM (gain cell) into practical use.

Solution to Problem

In order to solve the above-described problems, a memory device according to the present invention is a memory device through use of a semiconductor device, including a plurality of pages arrayed in a column direction, each of the pages being composed of a plurality of memory cells arrayed on a substrate in a row direction, in which each of the memory cells included in each of the pages has, a semiconductor base standing in a vertical direction or extending in a horizontal direction on the substrate with respect to the substrate, a first impurity layer and a second impurity layer located on opposite ends of the semiconductor base, a first gate insulating layer that surrounds part or whole of a side surface of the semiconductor base between the first impurity layer and the second impurity layer, and is in contact with or proximate to the first impurity layer, a second gate insulating layer that surrounds the side surface of the semiconductor base, connects to the first gate insulating layer, and is in contact with or proximate to the second impurity layer, a first gate conductor layer that covers part or whole of the first gate insulating layer, a second gate conductor layer that covers the second gate insulating layer, and a channel semiconductor layer in which the semiconductor base is covered by the first gate insulating layer and the second gate insulating layer, the memory device controls voltages to be applied to the first gate conductor layer, the second gate conductor layer, the first impurity region, and the second impurity region to perform a page write operation and a page erase operation, the first impurity layer of the each of the memory cells is connected to a source line, the second impurity layer is connected to a bit line, one of the first gate conductor layer and the second gate conductor layer is connected to a word line, and the other is connected to a first driving control line, the bit line is connected to a forced inversion type sense amplifier circuit via a switching circuit, and when in a page read operation, the memory device reads page data in a memory cell group selected by the word line to the bit line, and performs charge sharing between the bit line and a charge sharing node of the switching circuit opposite to the bit line to accelerate a read determination by the forced inversion type sense amplifier circuit (a first invention).

In the above-described first invention, the charge sharing node is preliminarily charged to a voltage equal to or higher than a voltage of the bit line before the page read operation is started (a second invention).

In the above-described first invention, a first gate capacitance between the first gate conductor layer and the channel semiconductor layer is larger than a second gate capacitance between the second gate conductor layer and the channel semiconductor layer (a third invention).

In the above-described first invention, when seen in a central axis direction, the first gate conductor layer surrounds the first gate insulating layer, and is separated into at least two conductor layers (a fourth invention).

In the above-described first invention, when in the page write operation, the memory device holds a hole group generated by an impact ionization phenomenon in the channel semiconductor layer to change a voltage of the channel semiconductor layer to a first data holding voltage which is higher than a voltage of one of or voltages of both of the first impurity layer and the second impurity layer, and when in the page erase operation, the memory device controls voltages to be applied to the first impurity layer, the second impurity layer, the first gate conductor layer, and the second gate conductor layer to extract the hole group from one or both of the first impurity layer and the second impurity layer, and change the voltage of the channel semiconductor layer to a second data holding voltage which is lower than the first data holding voltage (a fifth invention).

BRIEF DESCRIPTION OF DRAWINGS

FIGS. 2A, 2B and 2C show diagrams describing an effect in a case in which a gate capacitance of a first gate conductor layer 5a connected to a plate line PL of the memory device having the SGT according to the first embodiment is made larger than a gate capacitance of a second gate conductor layer 5b to which a word line WL is connected.

FIGS. 3AA, 3AB and 3AC shows diagrams for describing a write operation mechanism of the memory device having the SGT according to the first embodiment.

FIGS. 4BA, 4BB, 4BC and 4BD show diagrams for describing the page erase operation mechanism of the memory device having the SGT according to the first embodiment.

FIGS. 4DA, 4DB, 4DC and 4DD shows diagrams for describing the page erase operation mechanism of the memory device having the SGT according to the first embodiment.

FIGS. 4EA, 4EB, 4EC and 4ED show diagrams for describing the page erase operation mechanism of the memory device having the SGT according to the first embodiment.

FIGS. 5A, 5B and 5C show diagrams for describing a read operation mechanism of the memory device having the SGT according to the first embodiment.

FIG. 6A shows diagrams for describing, using a switching circuit and a forced inversion type sense amplifier circuit connected to a bit line of the memory device having the SGT according to the first embodiment, performing charge sharing between the bit line and a charge sharing node of the switching circuit opposite to the bit line to accelerate a read determination by the forced inversion type sense amplifier circuit.

FIG. 6D is a diagram for describing, using the switching circuit and the forced inversion type sense amplifier circuit connected to the bit line of the memory device having the SGT according to the first embodiment, performing charge sharing between the bit line and the charge sharing node of the switching circuit opposite to the bit line to accelerate the read determination by the forced inversion type sense amplifier circuit.

FIG. 6E is a diagram for describing a write operation of the forced inversion type sense amplifier circuit of the memory device having the SGT according to the first embodiment.

FIGS. 9A, 9B and 9C show diagrams showing a read operation of the capacitor-less DRAM memory cell according to the conventional example.

MODE FOR CARRYING OUT THE INVENTION

Hereinafter, embodiments of a memory device (hereinbelow referred to as a dynamic flash memory) through use of semiconductor device according to the present invention will be described with reference to the drawings.

First Embodiment

A structure and an operation mechanism of a dynamic flash memory cell according to a first embodiment of the present invention will be described with reference to FIGS. 1 to 5A-5C. The structure of the dynamic flash memory cell will be described with reference to FIG. 1. Then, an effect in a case in which a gate capacitance of a first gate conductor layer 5a connected to a plate line PL is made larger than a gate capacitance of a second gate conductor layer 5b to which a word line WL is connected will be described with reference to FIGS. 2A to 2C. Then, a data write operation mechanism will be described with reference to FIGS. 3AA to 3AC and 3B, a data erase operation mechanism will be described with reference to FIGS. 4A to 4EA-4ED, and a data read operation mechanism will be described with reference to FIGS. 5A-5C.

Figure 1:
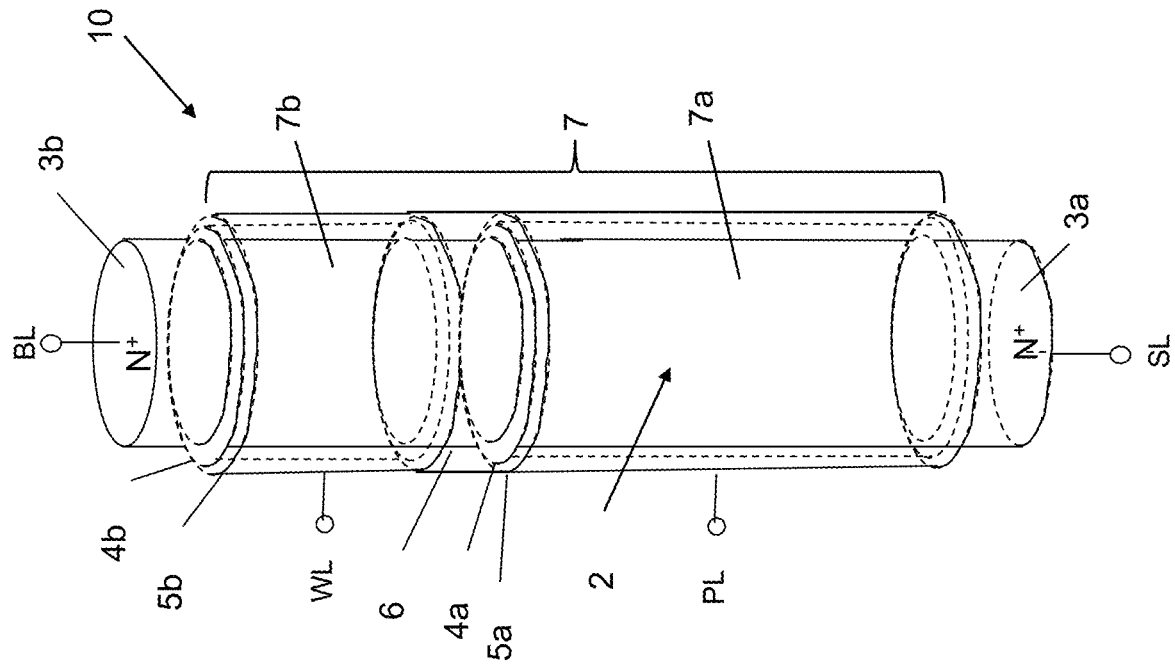
FIG. 1 is a structural diagram of a memory device having an SGT according to a first embodiment.

FIG. 1 shows the structure of the dynamic flash memory cell according to the first embodiment of the present invention. N$^+$ layers 3a and 3b (which are examples of a "first impurity layer" and a "second impurity layer" as claimed), which when one serves as a source, the other serves as a drain, are formed at upper and lower positions in a silicon semiconductor pillar 2 (hereinafter the silicon semiconductor pillar will be referred to as a "Si pillar") (which is an example of a "semiconductor base" as claimed) formed on a substrate and having a P-type or an i-type (intrinsic) conductivity type. A portion of the Si pillar 2 between these N$^+$ layers 3a and 3b to serve as the source and the drain serves as a channel region 7 (which is an example of a "channel semiconductor layer" as claimed). A first gate insulating layer 4a (which is an example of a "first gate insulating layer" as claimed) and a second gate insulating layer 4b (which is an example of a "second gate insulating layer" as claimed) are formed in a manner surrounding this channel region 7. The first gate insulating layer 4a and the second gate insulating layer 4b are respectively in contact with or proximate to the N$^+$ layers 3a and 3b to serve as the source and the drain. A first gate conductor layer 5a (which is an example of a "first gate conductor layer" as claimed) and a second gate conductor layer 5b (which is an example of a "second gate conductor layer" as claimed) are respectively formed in a manner surrounding the first gate insulating layer 4a and the second gate insulating layer 4b. Then, the first gate conductor layer 5a and the second gate conductor layer 5b are separated by an insulating layer 6 (which is an example of a "first insulating layer" as claimed). Then, the channel region 7 between the N$^+$ layers 3a and 3b is composed of a first channel Si layer 7a (which is an example of a "first channel semiconductor layer" as claimed) surrounded by the first gate insulating layer 4a and a second channel Si layer 7b (which is an example of a "second channel semiconductor layer" as claimed) surrounded by the second gate insulating layer 4b. A dynamic flash memory cell 10 composed of the N$^+$ layers 3a and 3b to serve as the source and the drain, the channel region 7, the first gate insulating layer 4a, the second gate insulating layer 4b, the first gate conductor layer 5a, and the second gate conductor layer 5b is thereby formed. Then, the N$^+$ layer 3a to serve as the source is connected to a source line SL (which is an example of a "source line" as claimed), the N$^+$ layer 3b to serve as the drain is connected to a bit line BL (which is an example of a "bit line" as claimed), the first gate conductor layer 5a is connected to the plate line PL (which is an example of a "first driving control line" as claimed), and the second gate conductor layer 5b is connected to the word line WL (which is an example of a "word line" as claimed), respectively. The dynamic flash memory cell 10 desirably has such a structure that the gate capacitance of the first gate conductor layer 5a to which the plate line PL is connected is larger than the gate capacitance of the second gate conductor layer 5b to which the word line WL is connected.

Note that in FIG. 1, the gate length of the first gate conductor layer 5a is made longer than the gate length of the second gate conductor layer 5b such that the gate capacitance of the first gate conductor layer 5a connected to the plate line PL is larger than the gate capacitance of the second gate conductor layer 5b to which the word line WL is connected. However, alternatively, film thicknesses of the respective gate insulating layers may be changed to make the film thickness of a gate insulating film of the first gate insulating layer 4a thinner than the film thickness of a gate insulating film of the second gate insulating layer 4b, rather than making the gate length of the first gate conductor layer 5a longer than the gate length of the second gate conductor layer 5b. Alternatively, materials of the respective gate insulating layers may be changed in dielectric constant to make the dielectric constant of the gate insulating film of the first gate insulating layer 4a higher than the dielectric constant of the gate insulating film of the second gate insulating layer 4b. Alternatively, any of the lengths of the gate conductor layers 5a and 5b, and the film thicknesses and the dielectric constants of the gate insulating layers 4a and 4b may be combined to make the gate capacitance of the first gate conductor layer 5a connected to the plate line PL larger than the gate capacitance of the second gate conductor layer 5b to which the word line WL is connected.

FIGS. 2A to 2C are diagrams describing an effect in the case in which the gate capacitance of the first gate conductor layer 5a connected to the plate line PL is made larger than the gate capacitance of the second gate conductor layer 5b to which the word line WL is connected.

FIG. 2A shows only essential portions of the structural diagram of the dynamic flash memory cell according to the first embodiment of the present invention in a simplified manner. The bit line BL, the word line WL, the plate line PL, and the source line SL are connected to the dynamic flash memory cell, and a potential level of the channel region 7 is determined depending on their voltage levels.

FIG. 2B is a diagram for describing a relationship between respective capacitances. A capacitance $C_{FB}$ of the channel region 7 is the sum of a capacitance $C_{WL}$ between the gate conductor layer 5b to which the word line WL is connected and the channel region 7, a capacitance $C_{PL}$ between the gate conductor layer 5a to which the plate line PL is connected and the channel region 7, a junction capacitance $C_{SL}$ of a PN junction between the source $N^+$ layer 3a to which the source line SL is connected and the channel region 7, and a junction capacitance $C_{BL}$ of a PN junction between the drain $N^+$ layer 3b to which the bit line BL is connected and the channel region 7, and is expressed as:

$$C_{FB}=C_{WL}+C_{PL}+C_{BL}+C_{SL} \quad (1)$$

Consequently, a coupling rate $\beta_{WL}$ between the word line WL and the channel region 7, a coupling rate $\beta_{PL}$ between the plate line PL and the channel region 7, a coupling rate $\beta_{BL}$ between the bit line BL and the channel region 7, and a coupling rate $\beta_{SL}$ between the source line SL and the channel region 7 are respectively expressed as follows:

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Herein, $\beta_{PL}>\beta_{WL}$ holds because $C_{PL}>C_{WL}$ holds.

FIG. 2C is a diagram for describing a change in the voltage $V_{FB}$ of the channel region 7 when a voltage $V_{WL}$ of the word line WL rises and thereafter drops in the read operation and the write operation. Herein, a potential difference $\Delta V_{FB}$ when the voltage $V_{FB}$ of the channel region 7 rises from a low voltage level $V_{FBL}$ to a high voltage level $V_{FBH}$ when the voltage $V_{WL}$ of the word line WL rises from 0 V to a high voltage level $V_{WLH}$ is expressed as follows:

$$\Delta V_{FB} = V_{FBH} - V_{FBL} \quad (6)$$

$$= \beta_{WL} \times V_{WLH}$$

Because of the small coupling rate $\beta_{WL}$ between the word line WL and the channel region 7 and the large coupling rate $\beta_{PL}$ between the plate line PL and the channel region 7, $\Delta V_{FB}$ is small, and the voltage $V_{FB}$ of the channel region 7 hardly changes even if the voltage $V_{WL}$ of the word line WL rises and drops in the read operation and the write operation.

Figure 3B:
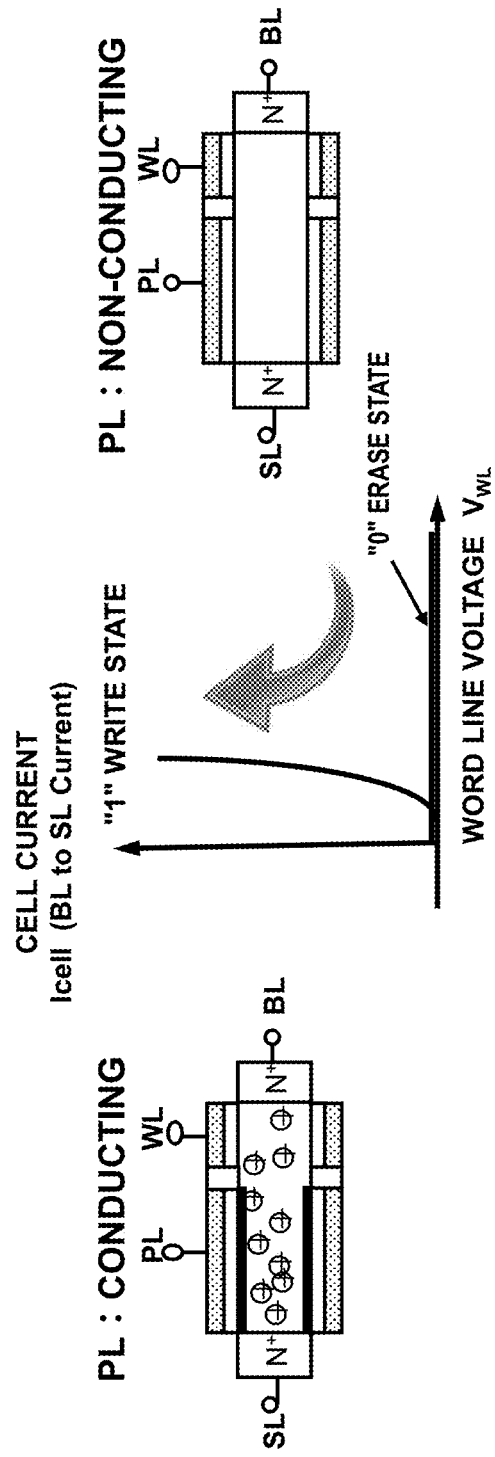
FIG. 3B shows diagrams for describing the write operation mechanism of the memory device having the SGT according to the first embodiment.

FIGS. 3AA to 3AC and FIG. 3B show a memory write operation (which is an example of a "memory write operation" as claimed) of the dynamic flash memory cell according to the first embodiment of the present invention. FIG. aAA shows a mechanism of the write operation, and FIG. 3AB shows operation waveforms of the bit line BL, the source line SL, the plate line PL, the word line WL, and the channel region 7 which is the floating body FB. At time T0, the dynamic flash memory cell is in a "0" erase state, and the voltage of the channel region 7 is $V_{FB}$"0". In addition, Vss is applied to the bit line BL, the source line SL, and the word line WL, while $V_{PLL}$ is applied to the plate line PL. Herein, Vss is 0 V and $V_{PLL}$ is 2 V, for example. Next, when the bit line BL rises from Vss to $V_{BLH}$ at time T1-T2, the voltage of the channel region 7 becomes $V_F$"0"+$\beta_{BL}\times V_{BLH}$ because of the capacitive coupling between the bit line BL and the channel region 7 in a case in which Vss is 0 V, for example.

The write operation of the dynamic flash memory cell will be described continuously with reference to FIGS. 3AA and 3AB. At time T3-T4, the word line WL rises from Vss to $V_{WLH}$. Thus, assuming that a "0" erase threshold voltage of a second N-channel MOS transistor region in which the second gate conductor layer 5b to which the word line WL is connected surrounds the channel region 7 is $Vt_{WL}$"0", the voltage of the channel region 7 becomes $V_{FB}$"0"+$\beta_{BL}\times V_{BLH}+\beta_{WL}\times Vt_{WL}$"0" in association with the increase in voltage of the word line WL from Vss to $Vt_{WL}$"0" because of the second capacitive coupling between the word line WL and the channel region 7. When the voltage of the word line WL rises to $Vt_{WL}$"0" or above, an annular inversion layer 12b is formed in the channel region 7 on the inner periphery of the second gate conductor layer 5b, and interrupts the second capacitive coupling between the word line WL and the channel region 7.

The write operation of the dynamic flash memory cell will be described continuously with reference to FIGS. 3AA and 3AB. At time T3-T4, $V_{PLL}$=2 V, for example, is fixedly input to the first gate conductor layer 5a to which the plate line PL is connected, and the second gate conductor layer 5b to which the word line WL is connected is raised to $V_{WLH}$=4 V, for example. As a result, as shown in FIG. 3AA, an annular inversion layer 12a is formed in the channel region 7 on the inner periphery of the first gate conductor layer 5a to which the plate line PL is connected, and a pinch-off point 13 is present in the inversion layer 12a. As a result, a first N-channel MOS transistor region having the first gate conductor layer 5a operates in a saturation region. On the other hand, the second N-channel MOS transistor region having the second gate conductor layer 5b to which the word line WL is connected operates in a linear region. As a result, a pinch-off point is not present in the channel region 7 on the inner periphery of the second gate conductor layer 5b to which the word line WL is connected, but the inversion layer 12b is formed all over the inner periphery of the gate conductor layer 5b. The inversion layer 12b formed all over the inner periphery of the second gate conductor layer 5b to which the word line WL is connected serves as a substantial drain of the second N-channel MOS transistor region having the second gate conductor layer 5b. As a result, the electric field is maximized in a first boundary region of the channel region 7 between the first N-channel MOS transistor region having the first gate conductor layer 5a and the second N-channel MOS transistor region having the second gate conductor layer 5b connected in series, and the impact ionization phenomenon occurs in this region. Since this region is a source-side region as seen from the second N-channel MOS transistor region having the second gate conductor layer 5b to which the word line WL is connected, this phenomenon is called a source-side impact ionization phenomenon. This source-side impact ionization phenomenon allows electrons to flow from the N⁺ layer 3a to which the source line SL is connected to the N⁺ layer 3b to which the bit line is connected. Accelerated electrons collide with lattice Si atoms, and electron-hole pairs are generated by kinetic energy thereof. Part of generated electrons flows to the first gate conductor layer 5a and the second gate conductor layer 5b, but a large part thereof flows to the N⁺ layer 3b to which the bit line BL is connected (not shown).

Then, as shown in FIG. 3AC, a hole group 9 (which is an example of a "hole group" as claimed) having been generated is a majority carrier in the channel region 7, and charges the channel region 7 to a positive bias. Since the N⁺ layer 3a to which the source line SL is connected is at 0 V, the channel region 7 is charged to a built-in voltage Vb (about 0.7 V) of the PN junction between the N⁺ layer 3a to which the source line SL is connected and the channel region 7. When the channel region 7 is charged to a positive bias, threshold voltages of the first N-channel MOS transistor region and the second N-channel MOS transistor region decrease because of a substrate bias effect.

The write operation of the dynamic flash memory cell will be described continuously with reference to FIG. 3AB. At time T6-T7, the voltage of the word line WL drops from $V_{WLH}$ to Vss. At that time, the word line WL and the channel region 7 form the second capacitive coupling, but the inversion layer 12b interrupts this second capacitive coupling until the voltage $V_{WLH}$ of the word line WL becomes less than or equal to a threshold voltage $Vt_{WL}$"1" of the second N-channel MOS transistor region when the voltage of the channel region 7 is Vb. Consequently, a substantial capacitive coupling between the word line WL and the channel region 7 is formed only when the word line WL becomes less than or equal to $Vt_{WL}$"1" and drops to Vss. As a result, the voltage of the channel region 7 becomes $Vb-\beta_{WL}\times Vt_{WL}$"1". Herein, $Vt_{WL}$"1" is lower than $Vt_{WL}$"0" described above, and $\beta_{WL}\times Vt_{WL}$"1" is small.

The write operation of the dynamic flash memory cell will be described continuously with reference to FIG. 3AB. At time T8-T9, the bit line BL drops from $V_{BLH}$ to Vss. Since the bit line BL and the channel region 7 are capacitively coupled, a "1" write voltage $V_{FB}$"1" of the channel region 7 is eventually expressed as follows:

$$V_{FB}\text{"1"}=Vb-\beta_{WL}\times Vt_{WL}\text{"1"}-\beta_{BL}\times V_{BLH} \quad (7)$$

Herein, the coupling ratio $\beta_{BL}$ between the bit line BL and the channel region 7 is also small. Thus, the threshold voltage of the second N-channel MOS transistor region in the second channel region 7b to which the word line WL is connected decreases as shown in FIG. 3B. The memory write operation of changing the "1" write voltage of the channel region 7 to a first data holding voltage (which is an example of a "first data holding voltage" as claimed) is performed for allocation to logic storage data "1".

Note that when in the write operation, electron-hole pairs may be generated by the impact ionization phenomenon in a second boundary region between the first impurity layer 3a and the first channel semiconductor layer 7a or a third boundary region between the second impurity layer 3b and the second channel semiconductor layer 7b instead of the first boundary region, and the channel region 7 may be charged with the generated hole group 9.

Note that conditions for voltages to be applied to the bit line BL, the source line SL, the word line WL, and the plate line PL described above as well as the potential of the floating body are an example for performing the write operation, and other operating conditions that enable the write operation may be adopted.

A mechanism of a memory erase operation (which is an example of a "memory erase operation" as claimed) will be described with reference to FIGS. 4A to 4EA-4ED.

Figure 4A:
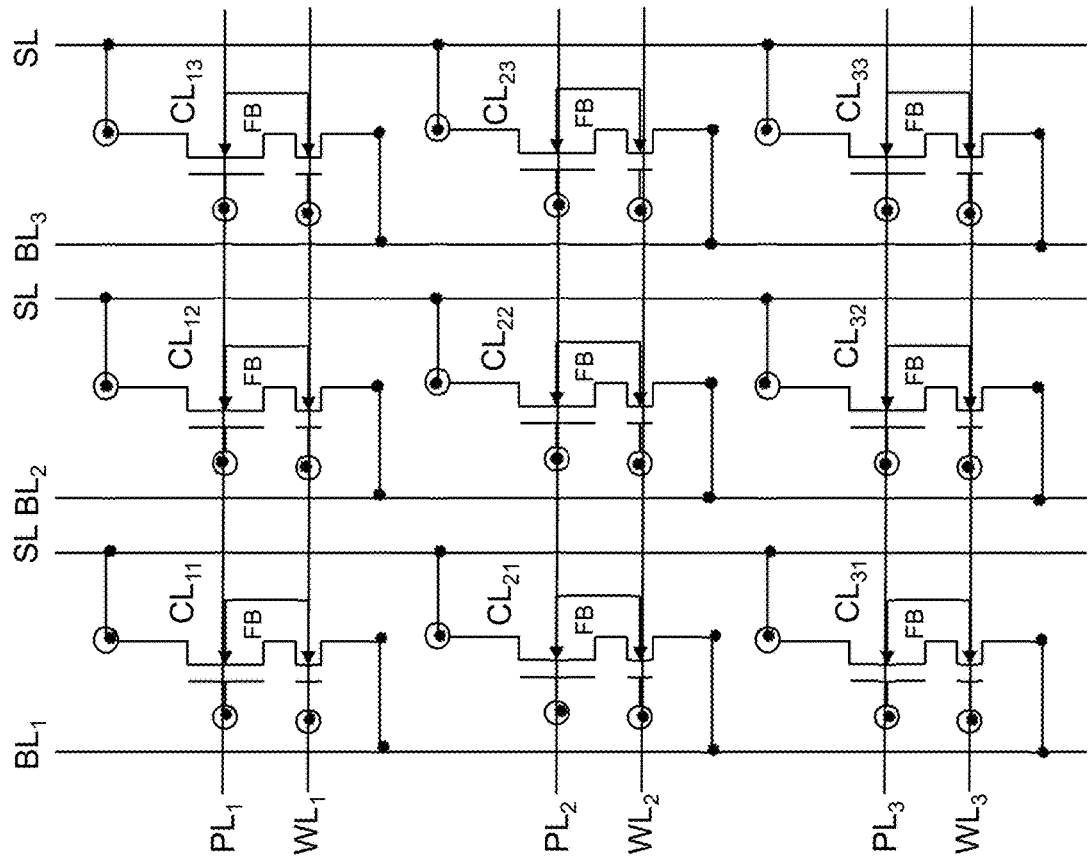
FIG. 4A is a diagram for describing a page erase operation mechanism of the memory device having the SGT according to the first embodiment.

FIG. 4A shows a memory block circuit diagram for describing the page erase operation. Herein, a total of 3×3 nine memory cells $CL_{11}$ to $CL_{33}$ are shown, but an actual memory block is larger than this matrix. When the memory cells are arrayed in matrix form, one direction of the array is referred to as a "row direction" (or "row form"), and a direction vertical to this is referred to as a "column direction" (or "column form"). The source line SL, bit lines $BL_1$ to $BL_3$, plate lines $PL_1$ to $PL_3$, and word lines $WL_1$ to $WL_3$ are connected to the respective memory cells. For example, it is assumed that memory cells $CL_{21}$ to $CL_{23}$ to which the plate line $PL_2$ and the word line $WL_2$ of any page (which is an example of a "page" as claimed) are connected are selected in this block, and the page erase operation is performed.

The mechanism of the page erase operation will be described with reference to FIGS. 4BA to 4BD and FIG. 4C. Herein, the channel region 7 between the N⁺ layers 3a and 3b are electrically isolated from the substrate, and is a floating body. FIG. 4BA shows a timing operation waveform diagram of the principal nodes in the erase operation. In FIG. 4BA, T0 to T12 represent times from the start to end of the erase operation. FIG. 4BB shows a state in which the hole group 9 generated by impact ionization in a preceding cycle is stored in the channel region 7 at time T0 before the erase operation. Then, at time T1-T2, the bit lines $BL_1$ to $BL_3$ and the source line SL rise from Vss to high voltage levels, $V_{BLH}$ and $V_{SLH}$, respectively. Herein, Vss is 0 V, for example. In this operation, at time T3-T4 in the next period, the plate line $PL_2$ and the word line $WL_2$ selected by the page erase operation are brought into high voltage levels from a first voltage $V_{PLL}$ to a second voltage $V_{PLH}$, and from a third voltage Vss to a fourth voltage $V_{WLH}$, respectively, so that the inversion layer 12a on the inner periphery of the first gate conductor layer 5a to which the plate line $PL_2$ is connected and the inversion layer 12b on the inner periphery of the second gate conductor layer 5b to which the word line $WL_2$ is connected are not formed in the channel region 7. Consequently, assuming that threshold voltages of the second N-channel MOS transistor region on the word line $WL_2$ side and the first N-channel MOS transistor region on the plate line $PL_2$ side are $V_{tWL}$ and $V_{tPL}$, respectively, the voltages $V_{BLH}$ and $V_{SLH}$ desirably satisfy $V_{BLH}>V_{WLH}+V_{tWL}$ and $V_{SLH}>V_{PLH}+V_{tPL}$. For example, in a case in which $V_{tWL}$ and $V_{tPL}$ are 0.5 V, $V_{WLH}$ and $V_{PLH}$ should be set at 3 V, and $V_{BLH}$ and $V_{SLH}$ should be set at more than or equal to 3.5 V.

The mechanism of the page erase operation of FIG. 4BA will be described continuously. At time T3-T4 as the first period, the voltage of the channel region 7 in the floating state is boosted by the first capacitive coupling between the plate line $PL_2$ and the channel region 7 and the second capacitive coupling between the word line $WL_2$ and the channel region 7 as the plate line $PL_2$ and the word line $WL_2$ are brought into the high voltage levels of the second voltage $V_{PLH}$ and the fourth voltage $V_{WLH}$. The voltage of the channel region 7 rises from $V_{FB}$"1" in the "1" write state to a high voltage. The reason why the voltage of the channel region 7 can be boosted is because the voltages of the bit lines $BL_1$ to $BL_3$ and the source line SL are as high as $V_{BLH}$ and $V_{SLH}$, so that the PN junction between the source N⁺ layer 3a and the channel region 7 and the PN junction between the drain N⁺ layer 3b and the channel region 7 are in a reverse-biased state.

The mechanism of the page erase operation of FIG. 4BA will be described continuously. At time T5-T6 as the next period, the voltages of the bit lines BL₁ to BL₃ and the source line SL drop from the high voltages, $V_{BLH}$ and $V_{SLH}$, to Vss. As a result, the PN junction between the source N⁺ layer 3a and the channel region 7 and the PN junction between the drain N⁺ layer 3b and the channel region 7 are brought into a forward-biased state as shown in FIG. 4BC, and a remaining hole group in the hole group 9 in the channel region 7 is discharged to the source N⁺ layer 3a and the drain N⁺ layer 3b. As a result, the voltage $V_{FB}$ of the channel region 7 drops to the built-in voltage Vb of the PN junction formed by the source N⁺ layer 3a and the channel region 7 which is the P layer and the PN junction formed by the drain N⁺ layer 3b and the channel region 7 which is the P layer.

The mechanism of the page erase operation of FIG. 4BA will be described continuously. Next, at time T7-T8, the voltages of the bit lines BL₁ to BL₃ and the source line SL rise from Vss to the high voltages, $V_{BLH}$ and $V_{SLH}$. According to this scheme, when the plate line PL₂ and the word line WL₂ drop from the second voltage $V_{PLH}$ and the fourth voltage $V_{WLH}$ to the first voltage $V_{PLL}$ and the third voltage Vss, respectively, at time T9-T10, the voltage $V_{FB}$ of the channel region 7 is efficiently dropped from Vb to $V_{FB}$"0" because of the first capacitive coupling between the plate line PL₂ and the channel region 7 and the second capacitive coupling between the word line WL₂ and the channel region 7 without forming the inversion layer 12a on the plate line PL₂ side and the inversion layer 12b on the word line WL₂ side in the channel region 7, as shown in FIG. 4BD. Consequently, the voltage difference $\Delta V_{FB}$ in the channel region 7 between the "1" write state and the "0" erase state is expressed by expressions below.

$$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"} \quad (9)$$
$$= \beta_{WL} \times V_{WLH} + \beta_{PL} \times (V_{PLH} - V_{PLL})$$
$$- \beta_{WL} \times Vt_{WL}\text{"1"} - \beta_{BL} \times V_{BLH}$$

Herein, the sum of $\beta_{WL}$ and $\beta_{PL}$ is more than or equal to 0.8, and $\Delta V_{FB}$ increases, enabling a sufficient margin to be attained.

Figure 4C:
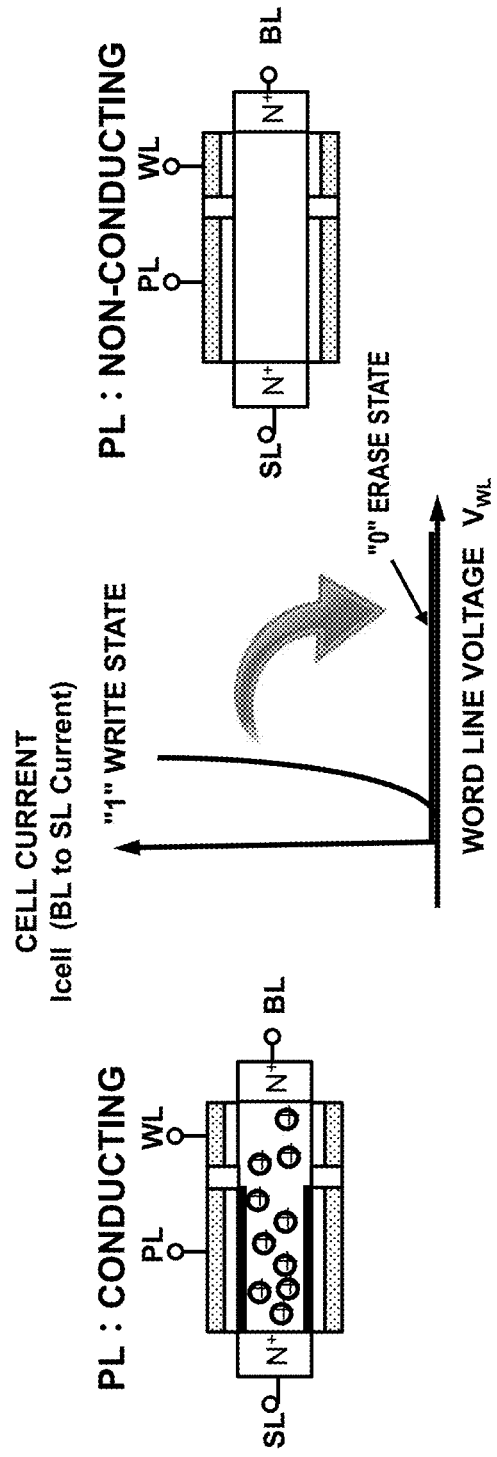
FIG. 4C shows diagrams for describing the page erase operation mechanism of the memory device having the SGT according to the first embodiment.

As a result, a wide margin is attained between the "1" write state and the "0" erase state as shown in FIG. 4C. Herein, in the "0" erase state, the threshold voltage on the plate line PL₂ side is high because of the substrate bias effect. Consequently, when the voltage to be applied to the plate line PL₂ is made less than or equal to the threshold voltage, for example, the first N-channel MOS transistor region on the plate line PL₂ side becomes non-conducting, thus not flowing a memory cell current. The way is shown by "PL: non-conducting" on the right side in FIG. 4C.

The page erase operation mechanism of FIG. 4BA will be described continuously. Next, at time T11-T12 as a fourth period, the voltages of the bit lines BL₁ to BL₃ and the source line SL decrease from $V_{BLH}$ to Vss and from $V_{SLH}$ to Vss, respectively, and the erase operation is terminated. On that occasion, the bit lines BL₁ to BL₃ and the source line SL slightly lower the voltage of the channel region 7 because of the capacitive couplings, which, however, is equivalent to the increase in the voltage of the channel region 7 by the bit lines BL₁ to BL₃ and the source line SL because of the capacitive couplings at time T7-T8. Thus, the increase and decrease in the voltages of the bit lines BL₁ to BL₃ and the source line SL cancel each other out, and the voltage of the channel region 7 is resultantly not affected. The page erase operation of changing the voltage $V_{FB}$"0" of this channel region 7 in the "0" erase state to a second data holding voltage (which is an example of a "second data holding voltage" as claimed) is performed for allocation to logic storage data "0". When reading data after the erase operation, a voltage to be applied to the first gate conductor layer 5a connecting to the plate line PL is set higher than the threshold voltage when the logic storage data is "1" and lower than the threshold voltage when the logic storage data is "0". A property in which no current flows even if the voltage of the word line WL is increased as shown in FIG. 4C is thereby obtained.

Next, the mechanism of the page erase operation will be described with reference to FIGS. 4DA to 4DD. FIGS. 4DA to 4DD are different from FIGS. 4BA to 4BD in that the bit lines BL₁ to BL₃ are set at Vss or the floating state and that the word line WL₂ is fixed at Vss during the page erase operation. This makes the second N-channel MOS transistor region of the word line WL₂ non-conducting even when the source line SL increases from Vss to $V_{SLH}$ at time T1-T2, and no memory cell current flows. This prevents the hole group 9 from being generated by the impact ionization phenomenon. As for the rest, the source line SL oscillates between Vss and $V_{SLH}$, and the plate line PL₂ oscillates between $V_{PLL}$ and $V_{PLH}$, similarly to FIGS. 4BA-4BD. As a result, the hole group 9 is discharged to the N⁺ layer 3a as the first impurity layer of the source line SL as shown in FIG. 4DC.

Next, the mechanism of the page erase operation will be described with reference to FIGS. 4EA to 4ED. FIGS. 4EA to 4ED are different from FIGS. 4BA to 4BD in that the source line SL is set at Vss or the floating state and that the plate line PL₂ is fixed at Vss during the page erase operation. This makes the first N-channel MOS transistor region of the plate line PL₂ non-conducting even when the bit lines BL₁ to BL₃ rise from Vss to $V_{BLH}$ at time T1-T2, and no memory cell current flows. This prevents the hole group 9 from being generated by the impact ionization phenomenon. As for the rest, the bit lines BL₁ to BL₃ oscillate between Vss and $V_{BLH}$, and the word line WL₂ oscillates between Vss and $V_{WLH}$, similarly to FIGS. 4BA to 4BD. As a result, the hole group 9 is discharged to the N⁺ layer 3b as the second impurity layer of the bit lines BL₁ to BL₃ as shown in FIG. 4EC.

Note that conditions for the voltages to be applied to the bit line BL, the source line SL, the word line WL, and the plate line PL described above as well as the potential of the floating body are an example for performing the page erase operation, and other operating conditions that enable the page erase operation may be adopted.

FIGS. 5A to 5C are diagrams for describing a read operation of the dynamic flash memory cell according to the first embodiment of the present invention. When the channel region 7 is charged to the built-in voltage Vb (about 0.7 V) as shown in FIG. 5A, the threshold voltage of the second N-channel MOS transistor region having the second gate conductor layer 5b to which the word line WL is connected is reduced because of the substrate bias effect. This state is allocated to the logic storage data "1". As shown in FIG. 5B, a memory block selected before performing writing has been brought into the erase state "0" in advance, and the voltage $V_{FB}$ of the channel region 7 has been set at $V_{FB}$"0". By the write operation, the write state "1" is stored at random. As a result, logic storage data of the logics "0" and "1" is created for the word line WL. As shown in FIG. 5C, the sense amplifier performs reading using the difference in level between the two threshold voltages for this word line WL. When reading data, the voltage to be applied to the first gate conductor layer 5a connecting to the plate line PL is set higher than the threshold voltage when the logic storage data is "1" and lower than the threshold voltage when the logic storage data is "0". A property in which no current flows even if the voltage of the word line WL is increased as shown in FIG. 5C is thereby obtained.

Note that conditions for the voltages to be applied to the bit line BL, the source line SL, the word line WL, and the plate line PL described above as well as the potential of the floating body are an example for performing the read operation, and other operating conditions that enable the read operation may be adopted.

Described with reference to FIGS. 6A to 6E is, using a switching circuit and a forced inversion type sense amplifier circuit (which is an example of a "forced inversion type sense amplifier circuit" as claimed) connected to the bit line BL of the dynamic flash memory cell according to the first embodiment of the present invention, when in the page read operation (which is an example of a "page read operation" as claimed), reading page data (which is an example of "page data" as claimed) in a memory cell group (which is an example of a "memory cell group" as claimed) selected by the word line WL to the bit line BL, and performing charge sharing between the bit line BL and a charge sharing node (which is an example of a "charge sharing node" as claimed) of the switching circuit opposite to the bit line to accelerate a read determination of the forced inversion type sense amplifier circuit.

FIG. 6A shows an operation waveform diagram of the principal nodes for describing in detail charge sharing during reading of the dynamic flash memory according to the first embodiment of the present invention. During reading, a charge sharing signal line FC first rises to a first high level VFCH1, and the bit line BL is charged to VReadBL=VFCH1-Vt1. Herein, Vt1 is a threshold voltage of a transistor TR11. Next, the bit line that reads the "1" write memory cell is discharged to Vss by the memory cell current. Next, the charge sharing signal line FC is set at a second high level VFCH2. If the bit line potential is lower than VFCH2-Vt1 at this time, the potential of a charge sharing node P instantaneously becomes less than or equal to VFCH2-Vt1 equal to the bit line. This is because a bit line capacitance CB is much larger than the parasitic capacitance CS of the charge sharing node. As a result, when a slight amplitude ΔVBL of the bit line becomes larger than VFCH2-VFCH1, the potential of the charge sharing node becomes a low level VPL=Vcc-Vt2. Herein, Vt2 is a threshold voltage of a transistor TR10. Since the transistor TR10 and the transistor TR11 are located proximate to each other in layout, process variations are equivalent, and Vt1=Vt2 holds. As a result, an amplitude ΔVP of the charge sharing node is amplified as ΔVP=(Vcc-Vt2)−(VFCH2-Vt1)=Vcc-VFCH2. In this manner, little influence is exerted on the potential difference (VFCH2-VFCH1) of the charge sharing signal line FC by the difference in threshold voltage caused by process variations, which enables a highly accurate sense operation to be performed at high speed.

Figure 6B:
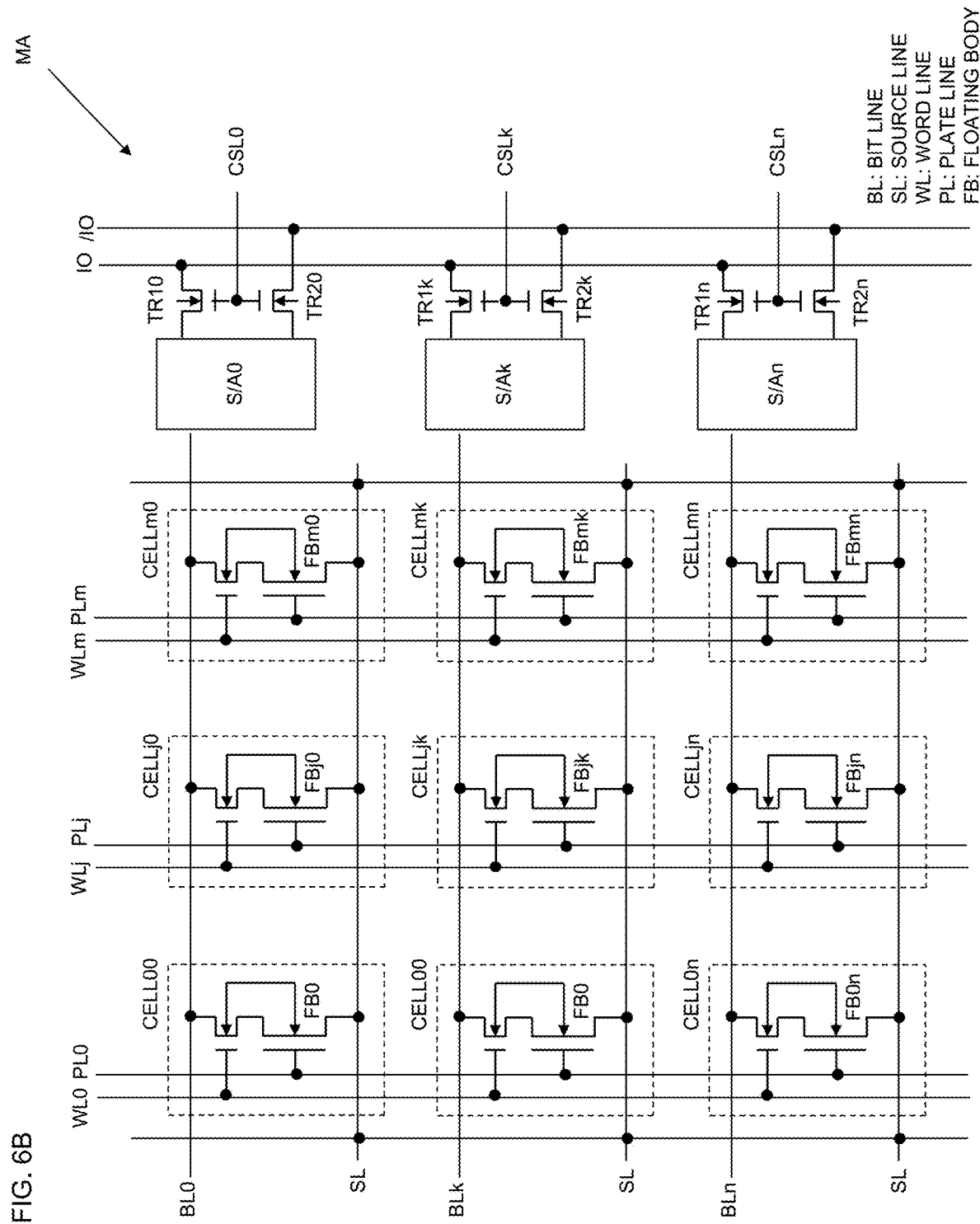
FIG. 6B is a diagram for describing, using the switching circuit and the forced inversion type sense amplifier circuit connected to the bit line of the memory device having the SGT according to the first embodiment, performing charge sharing between the bit line and the charge sharing node of the switching circuit opposite to the bit line to accelerate the read determination by the forced inversion type sense amplifier circuit.

FIG. 6B shows a memory cell array MA of the dynamic flash memory. Herein, (m+1)×(n+1) memory cells CELL00 to CELLmn are arrayed. To the respective memory cells, word lines WL0 to WLm and plate lines PL0 to PLm are connected in the row direction, and bit lines BL0 to BLn are connected in the column direction. The source line SL is connected to the substrate of the memory cells. This source line SL is negatively biased when erasing stored data in the memory cells. Consequently, writing and reading of the memory cells can be selectively performed by the word lines WL0 to WLm and the plate lines PL0 to PLm in the row direction and the bit lines BL0 to BLn in the column direction. Note that the bit lines BL0 to BLn are single ended, and are respectively connected to sense amplifiers S/A0 to S/An in which one of the bit lines BL0 to BLn performs reading and writing. In the memory cells CELL00 to CELLmn, the memory cell current flows only to memory cells in the "1" write state during reading, and the bit lines BL0 to BLn are discharged. In the "0" erase state, no memory cell current is flown. Consequently, forced inversion type latch-type sense amplifiers are used as the sense amplifiers S/A0 to S/An. Thus, flip flop circuits constituting the sense amplifiers are reset to one direction before inputting write data to the sense amplifiers S/A0 to S/An and before read data is latched. In addition, the sense amplifiers S/A0 to S/An are connected to complementary input/output lines IO and /IO via the transistors TR10 to TR2n. In addition, column select lines CSL0 to CSLn are connected to the gates of the transistors TR10 to TR2n. As a result, write data can selectively be input from the input/output lines IO and /IO to the sense amplifiers S/A0 to S/An by the column select lines CSL0 to CSLn. In addition, read data latched in the sense amplifiers S/A0 to S/An can selectively be read to the input/output lines IO and /IO by the column select lines CSL0 to CSLn.

Figure 6C:
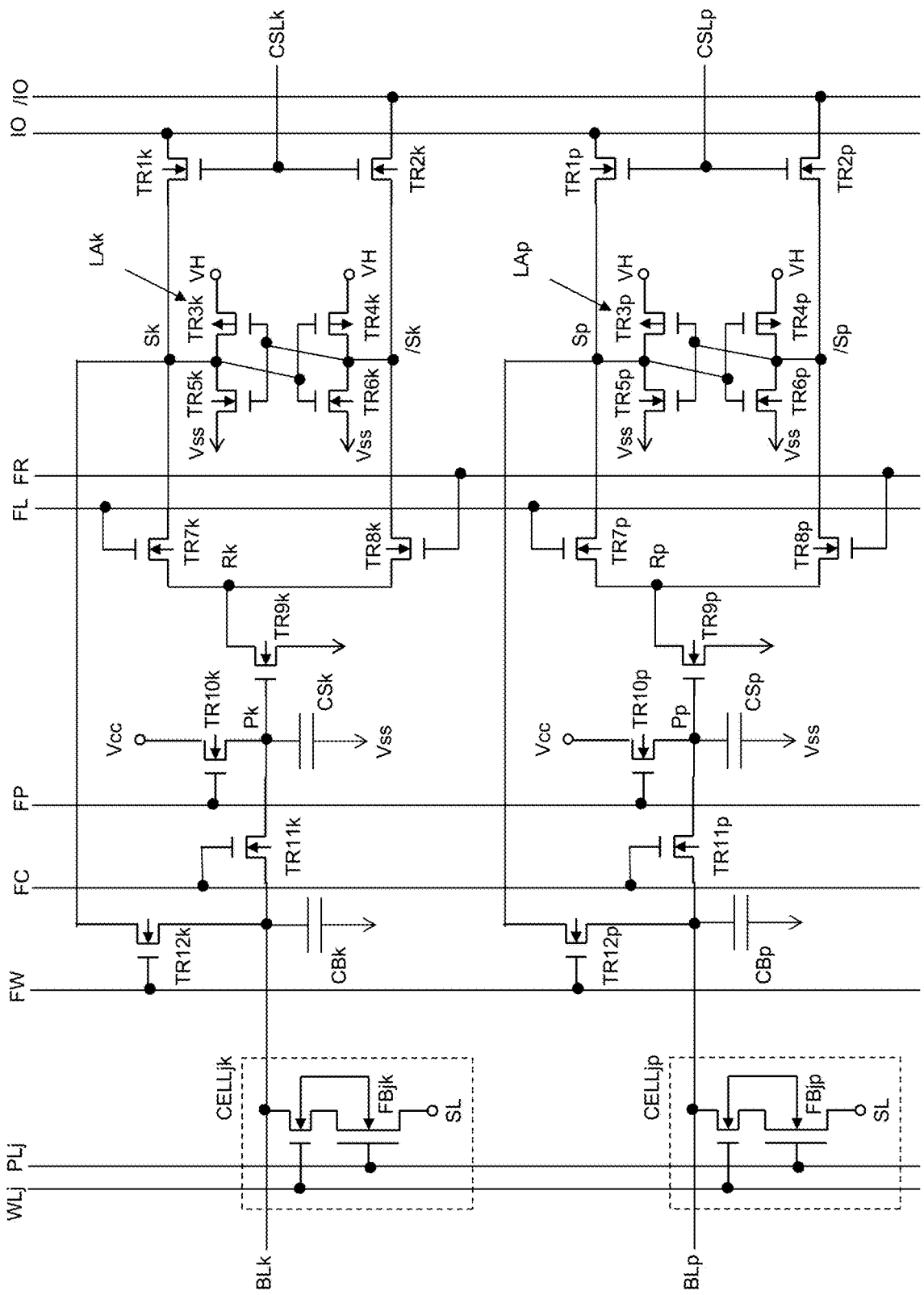
FIG. 6C is a diagram for describing, using the switching circuit and the forced inversion type sense amplifier circuit connected to the bit line of the memory device having the SGT according to the first embodiment, performing charge sharing between the bit line and the charge sharing node of the switching circuit opposite to the bit line to accelerate the read determination by the forced inversion type sense amplifier circuit.
Figure 7B:
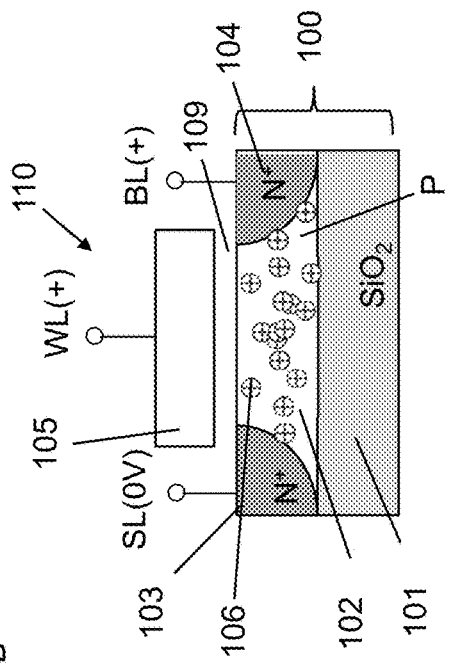
FIGS. 7A, 7B, 7C and 7D show diagrams for describing a write operation of a capacitor-less DRAM memory cell according to a conventional example.
Figure 7D:
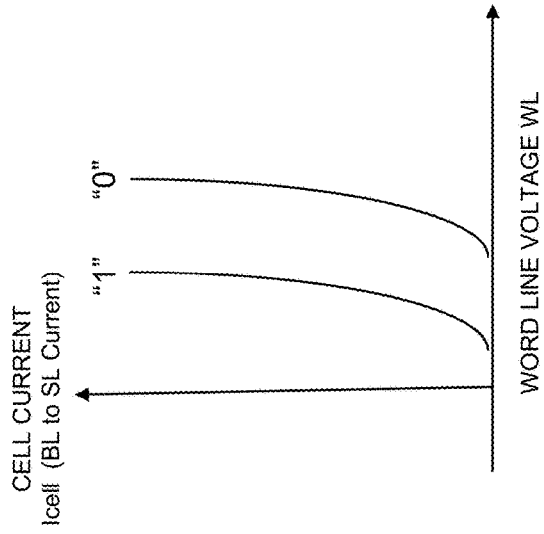
Figure 7A:
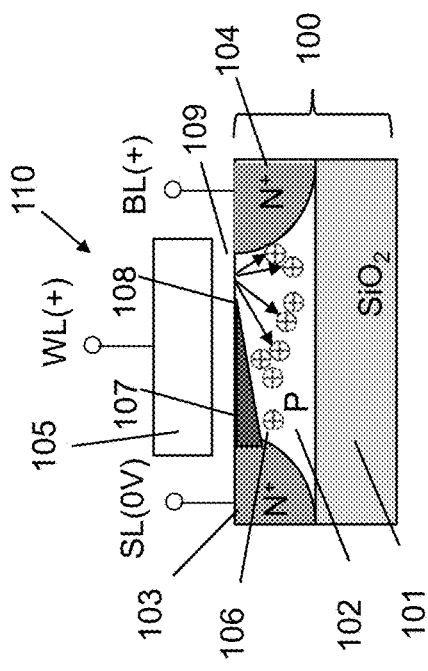
Figure 7C:
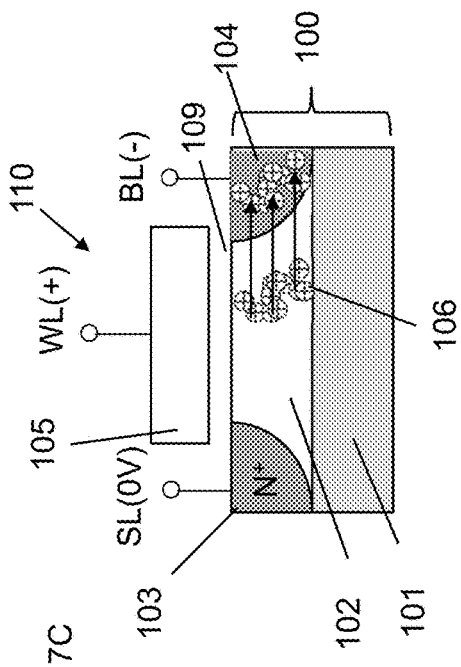
Figure 8A:
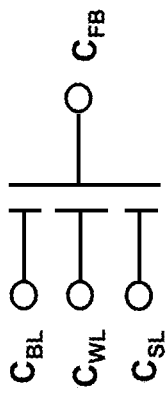
FIGS. 8A and 8B show diagrams for describing operational problems of the capacitor-less DRAM memory cell according to the conventional example.
Figure 8B:
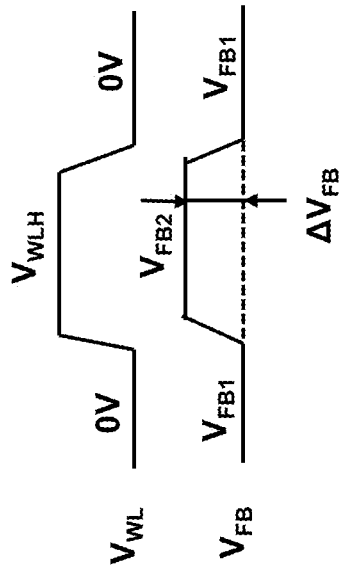

FIG. 6C shows a detailed circuit diagram of the sense amplifiers S/Ak and S/Ap shown in FIG. 6B. The sense amplifier S/Ak and S/Ap are composed of transistors TR3k to TR12k and capacitors CBk and CSk, and transistors TR3p to TR12p and capacitors CBp and CSp, respectively. Among them, TR3k, TR4k, TR3p, and TR4p are P-type MOS transistors, and TR5k to TR12k and TR5p to TR12p are N-type MOS transistors. Herein, latch-type sense amplifiers (flip flops) LAk and LAp are composed of the transistors TR3k to TR6k and the transistors TR3p to TR6p, respectively. The latch-type sense amplifiers LAk and LAp also have complementary sense nodes Sk, /Sk and Sp, /Sp. In addition, a left signal line FL is input to the gates of the transistors TR7k and TR7p, and a right signal line FR is input to the gates of the transistors TR8k and TR8p. In addition, the sources of the transistors TR7k and TR8k are connected to an activation node Rk, and the sources of the transistors TR7p and TR8p are connected to an activation node Rp. Then, the drains of the transistors TR9k and TR9p having charge sharing nodes Pk and Pp as the gate inputs are connected to the activation nodes Rk and Rp, respectively. A precharge signal line FP is input to the gates of the transistors TR10k and TR10p, and their sources are connected to the charge sharing nodes Pk and Pp. In addition, stray capacitors CSk and CSp are connected to the charge sharing nodes Pk and Pp, respectively. In addition, a write signal line FW is connected to the gates of the transistors TR12k and TR12p, and their sources are connected to the bit lines BLk and BLp, respectively. Then, bit line capacitances CBk and CBp are connected to the bit lines BLk and BLp, respectively. Herein, the bit line capacitances CBk and CBp are much larger than the parasitic capacitances CSk and CSp, and there are relationships of CBk>CSk and CBp>CSp. In addition, the transistors TR11k and TR11p having their gates connected to the charge sharing signal line FC are connected between the bit lines BLk, BLp and the charge sharing nodes Pk, Pp, respectively. The transistors TR11k and TR11p function as switching circuits.

The single-ended forced inversion type sense amplifiers S/Ak and S/Ap are configured as shown in FIG. 6C in detail. In addition, data read by the bit lines BLk and BLp are latched by the latch-type sense amplifiers (flip flops) LAk and LAp at high speed by virtue of the charge sharing nodes Pk and Pp.

FIG. 6D is an operation waveform diagram of the principal nodes during reading of the dynamic flash memory according to the first embodiment of the present invention. When the read operation is started at time tR0, the precharge signal line FP rises from Vss to VFPH. As a result, the charge sharing nodes Pk and Pp rise from Vss to Vcc, and the activation nodes Rk and Rp decrease from VRH to Vss. Then, when the right signal line FR rises from Vss to VFRH, the sense node Sk and the sense node Sp are preliminarily charged (which is an example of "preliminarily charged" as claimed) to an initial set value, VSH, and the latch-type sense amplifiers (flip flops) LAk and LAp are set up before read data is input. At this time, VSH has been preliminarily charged to a voltage equal to or higher than the voltage of the bit line BL. Next, when the charge sharing signal line FC rises from Vss to the first high level VFCH1 at time tR1, the bit line BLk and the bit line BLp are charged from Vss to a bit line read potential VReadBL. Next, when the word line WLj is selected at time tR2 and rises from Vss to VReadWL, data in the memory cells CELLjk and CELLjp are read to the bit lines BLk and BLp, respectively. In CELLjk in which "1" has been written, a memory cell current flows, and the bit line BLk is discharged from VReadBL and decreases to Vss. On the other hand, in CELLjp in the erase state "0", no memory cell current flows, and the bit line BLp is maintained at VReadBL. Note that the voltage of the plate line PL at this time is maintained at VReadPL. Then, when the charge sharing signal line FC rises from Vss to the second high level VFCH2, charges accumulated in the charge sharing nodes Pk and Pp are shared by the bit lines BLk and BLp. Since the potential of the bit line BLk reading "1" data is as low as Vss, charge sharing occurs between the bit line BLk and the charge sharing node Pk, and the potential of the charge sharing node Pk rapidly drops. Thereafter, when the potential of the left signal line FL rises from Vss to VFLH, the sense node Sp decreases from VSH to Vss, and "0" is latched in the latch-type sense amplifier LAp. On the other hand, the sense node Sk is maintained at VSH, and "1" is latched in the latch-type sense amplifier LAk. Thereafter, when the column select line CSLk is selected at time tR3 and rises from Vss to VCSLH, the data "1" latched in the latch-type sense amplifier LAk is read to the input/output lines IO and /IO, so that IO rises to VIOH, and /IO decreases to Vss. Next, when the column select line CSLp is selected and rises from Vss to VCSLH, the data "0" latched in the latch-type sense amplifier LAp is read to the input/output lines IO and /IO, so that IO becomes Vss, and /IO becomes VIOBH.

FIG. 6E is an operation waveform diagram of the principal nodes during writing of the dynamic flash memory according to the first embodiment of the present invention. When writing of the dynamic flash memory is started at start time tP0, the precharge signal line FP rises from Vss to VFPH. As a result, the charge sharing nodes Pk and Pp rise from Vss to Vcc, and the activation nodes Rk and Rp decrease from VRH to Vss. Then, when the left signal line FL rises from Vss to VFLH, the sense node Sk and the sense node Sp are initially set at Vss, and before write data is input, the latch-type sense amplifiers (flip flops) LAk and LAp are set up. Next, at time tP1, the input/output line IO becomes VIOH and the input/output line /IO becomes Vss, and when the column select line CSLk rises from Vss to VCSLH while write data is being input, the transistors TR1k and TR2k conduct to each other, so that the write data is captured into the latch-type sense amplifier LAk. After the column select line CSLk decreases from VCSLH to Vss, when the input/output line IO becomes Vss and the input/output line /IO becomes VIOH in turn, and the column select line CSLp rises from Vss to VCSLH, the transistors TRp and TR2p conduct to each other, so that write data is captured into the latch-type sense amplifier LAp. In this manner, a plurality of pieces of write data are captured into the latch-type sense amplifiers (not shown). Thereafter, when the write signal line FW rises from Vss to VFWH at time tP2, the bit line BLk is charged to a voltage VProgBL for writing "1" via the transistor TR12k. In addition, the voltage of the bit line BLp maintained at the erase state, to which "1" is not to be written, is maintained at Vss. Thereafter, when the word line WLj is selected at time tP3 and rises from Vss to VProgWL, the impact ionization phenomenon occurs in the channel region 7 of the memory cell CELLjk, a hole group is generated, and "1" is written into a floating body FBjk of the channel region 7. Note that the plate line PLj at this time is maintained at VProgPL. On the other hand, since the bit line BLp of the memory cell CELLjp is at Vss, the impact ionization phenomenon does not occur in the channel region 7 in this memory cell CELLjp. As a result, the "0" erase state is maintained. In this manner, "1" data can selectively be written into the memory cells CELLjk and CELLjp depending on data in the latch-type sense amplifiers LAk and LAp.

In FIG. 1, the Si pillar 2 enables the dynamic flash memory operation described in the present embodiment to be performed even if its horizontal cross-sectional shape is circular, elliptic, or rectangular. In addition, circular, elliptic, or rectangular dynamic flash memory cells may be present in a mixed manner on the same chip.

In addition, the dynamic flash memory device has been described with reference to FIG. 1 using, as an example, the SGT provided with the first gate insulating layer 4a and the second gate insulating layer 4b that surround the whole of the side surface of the Si pillar 2 standing in the vertical direction on the substrate, and having the first gate conductor layer 5a and the second gate conductor layer 5b that surround the first gate insulating layer 4a and the second gate insulating layer 4b as a whole. As stated in the description of the present embodiment, the present dynamic flash memory device should have a structure that satisfies the condition that the hole group 9 generated by the impact ionization phenomenon is held in the channel region 7. For this purpose, the channel region 7 should have a floating body structure isolated from a substrate 1. This enables the aforementioned dynamic flash memory operation to be performed using the Gate All Around (GAA: see Non Patent Literature 11, for example) technology, which is one of the SGT, for example, and the Nanosheet technology (see Non Patent Literature 12, for example) even if a semiconductor base of the channel region is formed horizontally with respect to the substrate 1. Alternatively, a device structure (see Non Patent Literatures 7 to 10, for example) through use of a silicon on insulator (SOI) may be adopted. In this device structure, the bottom of a channel region is in contact with an insulating layer of an SOI substrate, and surrounds another channel region, and is surrounded by a gate insulating layer and a device isolation insulating layer. In this structure, the channel region also has the floating body structure. In this manner, the dynamic flash memory device provided by the present embodiment should satisfy the condition that the channel region has the floating body structure. Alternatively, a structure in which a Fin transistor (see Non Patent Literature 13, for example) is formed on a SOI substrate also enables the present dynamic flash operation to be performed as long as the channel region has the floating body structure.

Alternatively, in "1" writing, electron-hole pairs may be generated using a gate induced drain leakage (GIDL) current (see Non Patent Literature 14, for example), and the channel region 7 may be filled with the generated hole group.

In addition, Expressions (1) to (12) in the present description and drawings are expressions used for qualitatively describing the phenomenon, and the phenomenon is not limited by those expressions.

Note that although the reset voltage of the word line WL, the bit line BL, and the source line SL is described as Vss in the description of FIGS. 3AA to 3AC and 3B, voltages different from each other may be used.

In addition, an example of page erase operation conditions is shown in FIG. 4A and description thereof. On the other hand, the voltages to be applied to the source line SL, the plate line PL, the bit line BL, and the word line WL may be changed as long as a state in which the hole group 9 present in the channel region 7 is removed from either or both of the N$^+$ layer 3a and the N' layer 3b can be achieved. Alternatively, in the page erase operation, a voltage may be applied to the source line SL of a selected page, and the bit line BL may be brought into the floating state. Alternatively, in the page erase operation, a voltage may be applied to the bit line BL of a selected page, and the source line SL may be brought into the floating state.

In addition, in FIG. 1, potential distributions of the first channel region 7a and the second channel region 7b are formed continuously in the channel region 7 at a portion surrounded by the insulating layer 6 which is the first insulating layer in the vertical direction. This makes the channel region 7 including the first channel region 7a and the second channel region 7b continuous in the vertical direction in the region surrounded by the insulating layer 6 which is the first insulating layer.

Note that in FIG. 1, it is desirable to make the vertical length of the first gate conductor layer 5a to which the plate line PL is connected even longer than the vertical length of the second gate conductor layer 5b to which the word line WL is connected to satisfy $C_{PL}>C_{WL}$. However, merely by adding the plate line PL, the coupling ratio of the capacitive coupling of the word line WL to the channel region 7 ($C_{WL}/(C_{PL}+C_{WL}+C_{BL}+C_{SL})$) decreases. As a result, the potential variation $\Delta V_{FB}$ of the channel region 7 as the floating body decreases.

In addition, a fixed voltage of approximately 1 V may be applied, for example, as the voltage $V_{pLL}$ of the plate line PL.

Note that the meaning of "covers" in a case in which the present description and claims state that "a gate insulating layer, a gate conductor layer, or the like covers a channel and the like" includes a case of surrounding the whole as in the SGT and GAA, a case of surrounding the whole except a portion as in a Fin transistor, and even such a case of overlapping a planar object as in a planar transistor.

In FIG. 1, the first gate conductor layer 5a surrounds the whole of the first gate insulating layer 4a. On the other hand, the first gate conductor layer 5a may be structured to surround part of the first gate insulating layer 4a in plan view. This first gate conductor layer 5a may be divided into at least two gate conductor layers to be operated as electrodes of the plate line PL. Similarly, the second gate conductor layer 5b may be divided into two or more to be operated synchronously or asynchronously, each serving as a conductor electrode of the word line. The dynamic flash memory operation can thereby be performed.

The page read operation of the 1-bit dynamic flash memory cell composed of a single semiconductor base has been described with reference to FIGS. 6A to 6E, whilst the present invention is also effective for each operation mode of a 1-bit high-speed dynamic flash memory cell composed of two semiconductor bases that store "1" and "0" complementary data.

Alternatively, in FIG. 1, the first gate conductor layer 5a may be connected to the word line WL, and the second gate conductor layer 5b may be connected to the plate line PL. This also enables the present dynamic flash memory operation described above to be performed.

In addition, the conditions for the voltages to be applied to the bit line BL, the source line SL, the word line WL, and the plate line PL as well as the potential of the floating body described above are an example for performing basic operations of the erase operation, the write operation, and the read operation. Any other voltage conditions that enable the basic operations of the present invention to be performed may be adopted.

The present embodiment provides the following features.
(Feature 1)

In the dynamic flash memory cell of the present embodiment, the N$^+$ layers 3a and 3b to serve as the source and the drain, the channel region 7, the first gate insulating layer 4a, the second gate insulating layer 4b, the first gate conductor layer 5a, and the second gate conductor layer 5b are formed into a pillar shape as a whole. In addition, the N$^+$ layer 3a to serve as the source is connected to the source line SL, the N$^+$ layer 3b to serve as the drain is connected to the bit line BL, the first gate conductor layer 5a is connected to the plate line PL, and the second gate conductor layer 5b is connected to the word line WL, respectively. The present dynamic flash memory cell is characteristic for such a structure that the gate capacitance of the first gate conductor layer 5a to which the plate line PL is connected is larger than the gate capacitance of the second gate conductor layer 5b to which the word line WL is connected. In the present dynamic flash memory cell, the first gate conductor layer and the second gate conductor layer are stacked in the vertical direction. Thus, the memory cell area is not increased in plan view even with the structure in which the gate capacitance of the first gate conductor layer 5a to which the plate line PL is connected is larger than the gate capacitance of the second gate conductor layer 5b to which the word line WL is connected. This enables higher performance and higher integration of the dynamic flash memory cell to be achieved at the same time.
(Feature 2)

The sense amplifier that performs reading and writing of the dynamic flash memory cell according to the first embodiment of the present invention is the forced inversion type sense amplifier to which a single-ended bit line is input, and can amplify a slight reading amplitude of the bit line at high speed using the charge sharing circuit having resistance to process variations to perform reading. As a result, a significantly faster system can be achieved. Features of the sense amplifier can be summarized as follows:

(1) Since the forced inversion type latch-type sense amplifier is used as the sense amplifier, a flip flop circuit constituting the sense amplifier is reset to one direction before inputting write data and before latching read data.

(2) The charge sharing circuit capable of sensing a slight amplitude of the bit line can sense and rapidly amplify the slight amplitude of the bit line.

(3) The design is such that a highly reliable sense operation can be obtained since the charge sharing circuit prevents the threshold voltage of a neighboring transistor from varying greatly even if process variations occur.

(Feature 3)

Paying attention to the role of the first gate conductor layer 5a of the dynamic flash memory cell according to the first embodiment of the present invention to which the plate line PL is connected, the voltage of the word line WL oscillates up and down when the dynamic flash memory cell performs the write and read operations. On this occasion, the plate line PL serves to reduce the capacitive coupling ratio between the word line WL and the channel region 7. As a result, an influence to be exerted upon voltage changes in the channel region 7 when the voltage of the word line WL oscillates up and down can be significantly reduced. The threshold voltage difference in the transistor region of the word line WL indicating the logics "0" and "1" can thereby be increased. This leads to a wider operation margin of the dynamic flash memory cell.

(Feature 4)

In FIGS. 6A to 6E, the plate line PL may be shared in the block of the memory cells CELL00 to CELLmn, for example. As a result, not only a simplified process and circuit but also a further increase in speed can be achieved.

Other Embodiments

Note that although a Si pillar is formed in the present invention, a semiconductor pillar made of a semiconductor material other than Si may be formed. The same applies to other embodiments according to the present invention.

In addition, in "1" writing, electron-hole pairs may be generated by the impact ionization phenomenon through use of a gate induced drain leakage (GIDL) current described in Non Patent Literature 10 and Non Patent Literature 14, and the floating body FB may be filled with the generated hole group. The same applies to other embodiments according to the present invention.

In addition, in FIG. 1, the dynamic flash memory operation is also performed in a structure obtained by reversing the polarities of the conductivity types of the $N^+$ layers 3a, 3b and the P-layer Si pillar 2. In this case, the majority carriers are electrons in the Si pillar 2 which is the N-type. Therefore, the electron group generated by impact ionization is stored in the channel region 7, and the "1" state is set.

In addition, various embodiments and modifications of the present invention may be made without departing from the broad spirit and scope of the present invention. In addition, each of the embodiments described above is for describing an embodiment of the present invention, and does not limit the scope of the present invention. The above-described embodiments and modifications can be combined with each other in any way. Furthermore, embodiments from which some of constituent features of the embodiments are removed according to necessity also fall within the technical idea of the present invention.

INDUSTRIAL APPLICABILITY

The memory device through use of a semiconductor device according to the present invention enables a dynamic flash memory which is a memory device through use of a high-density and high-performance SGT to be obtained.

The invention claimed is:

1. A memory device through use of a semiconductor device, including a plurality of pages arrayed in a column direction, each of the pages being composed of a plurality of memory cells arrayed on a substrate in a row direction, wherein each of the memory cells included in each of the pages has,
  a semiconductor base standing in a vertical direction or extending in a horizontal direction on the substrate with respect to the substrate,
  a first impurity layer and a second impurity layer located on opposite ends of the semiconductor base,
  a first gate insulating layer that surrounds part or whole of a side surface of the semiconductor base between the first impurity layer and the second impurity layer, and is in contact with or proximate to the first impurity layer,
  a second gate insulating layer that surrounds the side surface of the semiconductor base, connects to the first gate insulating layer, and is in contact with or proximate to the second impurity layer,
  a first gate conductor layer that covers part or whole of the first gate insulating layer,
  a second gate conductor layer that covers the second gate insulating layer, and
  a channel semiconductor layer in which the semiconductor base is covered by the first gate insulating layer and the second gate insulating layer,
the memory device controls voltages to be applied to the first gate conductor layer, the second gate conductor layer, the first impurity region, and the second impurity region to perform a page write operation and a page erase operation,
the first impurity layer of the each of the memory cells is connected to a source line, the second impurity layer is connected to a bit line, one of the first gate conductor layer and the second gate conductor layer is connected to a word line, and the other is connected to a first driving control line,
the bit line is connected to a forced inversion type sense amplifier circuit via a switching circuit, and
when in a page read operation, the memory device reads page data in a memory cell group selected by the word line to the bit line, and performs charge sharing between the bit line and a charge sharing node of the switching circuit opposite to the bit line to accelerate a read determination by the forced inversion type sense amplifier circuit.

2. The memory device through use of a semiconductor device according to claim 1, wherein the charge sharing node is preliminarily charged to a voltage equal to or higher than a voltage of the bit line before the page read operation is started.

3. The memory device through use of a semiconductor device according to claim 1, wherein a first gate capacitance between the first gate conductor layer and the channel semiconductor layer is larger than a second gate capacitance between the second gate conductor layer and the channel semiconductor layer.

4. The memory device through use of a semiconductor device according to claim 1, wherein when seen in a central axis direction, the first gate conductor layer surrounds the first gate insulating layer, and is separated into at least two conductor layers.

5. The memory device through use of a semiconductor device according to claim 1, wherein
  when in the page write operation, the memory device holds a hole group generated by an impact ionization phenomenon in the channel semiconductor layer to change a voltage of the channel semiconductor layer to a first data holding voltage which is higher than a voltage of one of or voltages of both of the first impurity layer and the second impurity layer, and
  when in the page erase operation, the memory device controls voltages to be applied to the first impurity layer, the second impurity layer, the first gate conductor layer, and the second gate conductor layer to extract the hole group from one or both of the first impurity layer and the second impurity layer, and change the voltage of the channel semiconductor layer to a second data holding voltage which is lower than the first data holding voltage.

* * * * *

UNITED STATES PATENT AND TRADEMARK OFFICE
CERTIFICATE OF CORRECTION

| | | |
|---|---|---|
| PATENT NO. | : 12,108,589 B2 | Page 1 of 1 |
| APPLICATION NO. | : 17/741914 | |
| DATED | : October 1, 2024 | |
| INVENTOR(S) | : Koji Sakui and Nozomu Harada | |

It is certified that error appears in the above-identified patent and that said Letters Patent is hereby corrected as shown below:

On the Title Page

Below "US 2022/0367469 A1 Nov. 17, 2022", please insert the following:
--(30) Foreign Application Priority Data May 13, 2021 (WO) PCT/JP2021/018247--

Signed and Sealed this
Thirty-first Day of December, 2024

Derrick Brent
*Acting Director of the United States Patent and Trademark Office*